US009531303B2

(12) United States Patent
Sherrit et al.

(10) Patent No.: US 9,531,303 B2
(45) Date of Patent: Dec. 27, 2016

(54) FLOW ENERGY PIEZOELECTRIC BIMORPH NOZZLE HARVESTER

(71) Applicants: California Institute of Technology, Pasadena, CA (US); CHEVRON U.S.A. INC., San Ramon, CA (US)

(72) Inventors: Stewart Sherrit, La Crescenta, CA (US); Phillip E. Walkemeyer, Pasadena, CA (US); Jeffrey L. Hall, Pasadena, CA (US); Hyeong Jae Lee, Pasadena, CA (US); Tim Colonius, Sierra Madre, CA (US); Phillipe Tosi, Houston, TX (US); Namhyo Kim, Houston, TX (US); Kai Sun, Missouri City, TX (US); Thomas Gary Corbett, Willis, TX (US); Alvaro Jose Arrazola, Houston, TX (US)

(73) Assignees: CALIFORNIA INSTITUTE OF TECHNOLOGY, Pasadena, CA (US); CHEVRON U.S.A. INC., San Ramon, CA (US)

( * ) Notice: Subject to any disclaimer, the term of this patent is extended or adjusted under 35 U.S.C. 154(b) by 412 days.

(21) Appl. No.: 14/261,412

(22) Filed: Apr. 24, 2014

(65) Prior Publication Data

US 2014/0319970 A1 Oct. 30, 2014

Related U.S. Application Data

(60) Provisional application No. 61/815,647, filed on Apr. 24, 2013.

(51) Int. Cl.
*H01L 41/08* (2006.01)
*H02N 2/18* (2006.01)
*H01L 41/113* (2006.01)

(52) U.S. Cl.
CPC ............ *H02N 2/185* (2013.01); *H01L 41/1136* (2013.01)

(58) Field of Classification Search
CPC .......................... H02N 2/185; H01L 41/1136
(Continued)

(56) References Cited

U.S. PATENT DOCUMENTS 5,823,265 A * 10/1998 Crow ...................... E21B 34/06
166/110
7,453,187 B2 11/2008 Richards et al.
(Continued)

FOREIGN PATENT DOCUMENTS

JP     2005-292941 A    10/2005
WO    WO 2007/071975 A1  6/2007

OTHER PUBLICATIONS

International Search Report and Written Opinion for International Application No. PCT/US2014/035374, mailed Sep. 1, 2014, 9 pages.

*Primary Examiner* — Thomas Dougherty
*Assistant Examiner* — Karen B Addison
(74) *Attorney, Agent, or Firm* — Lewis Roca Rothgerber Christie LLP

(57) ABSTRACT

A flow energy harvesting device having a harvester pipe includes a flow inlet that receives flow from a primary pipe, a flow outlet that returns the flow into the primary pipe, and a flow diverter within the harvester pipe having an inlet section coupled to the flow inlet, a flow constriction section coupled to the inlet section and positioned at a midpoint of the harvester pipe and having a spline shape with a substantially reduced flow opening size at a constriction point along the spline shape, and an outlet section coupled to the constriction section. The harvester pipe may further include a piezoelectric structure extending from the inlet section through the constriction section and point such that the fluid (Continued)

flow past the constriction point results in oscillatory pressure amplitude inducing vibrations in the piezoelectric structure sufficient to cause a direct piezoelectric effect and to generate electrical power for harvesting.

20 Claims, 24 Drawing Sheets

(58) Field of Classification Search
USPC .................................. 310/339, 330, 332, 328
IPC ......................................................... H02N 2/18
See application file for complete search history.

(56) References Cited

U.S. PATENT DOCUMENTS

2009/0140604 A1\* 6/2009 Chen ................... E21B 41/0085
310/311
2012/0119621 A1 5/2012 Frey et al.

\* cited by examiner

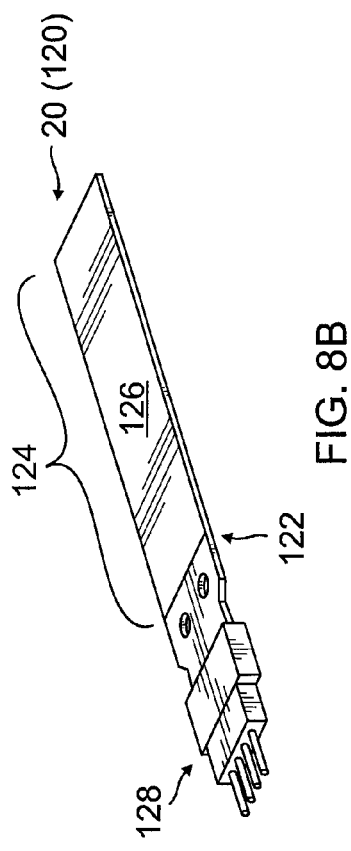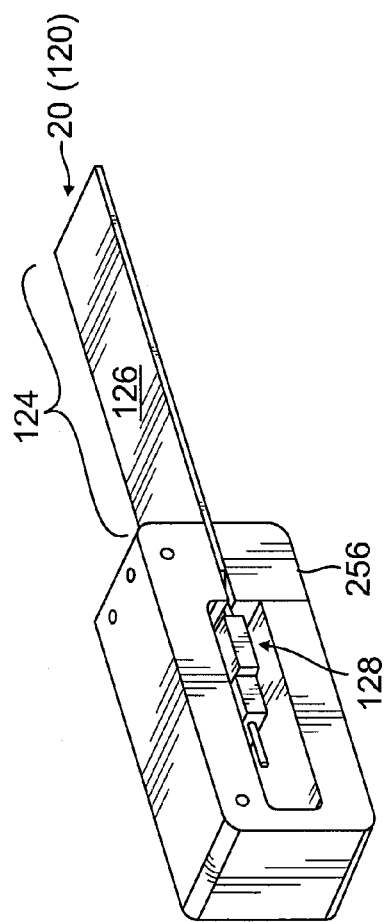

Harvester OD / ID dimensions

6" ID (tubing OD)

1/8" clearance to casing wall

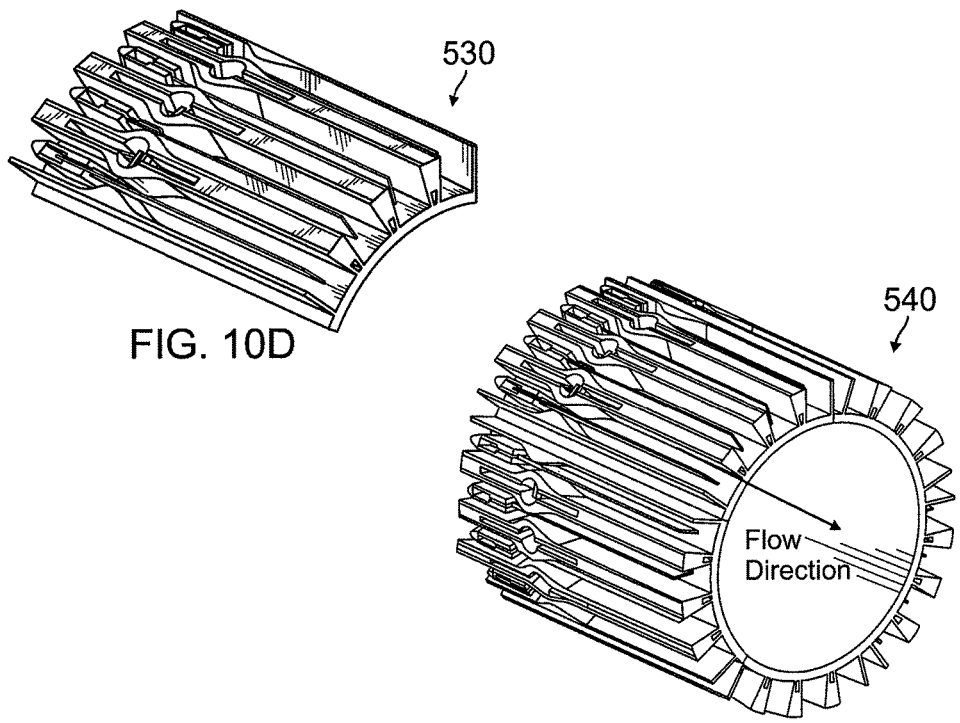
FIG. 10D
FIG. 10E
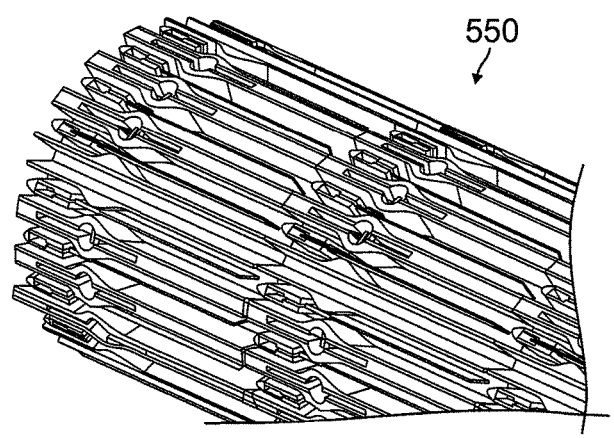
FIG. 10F

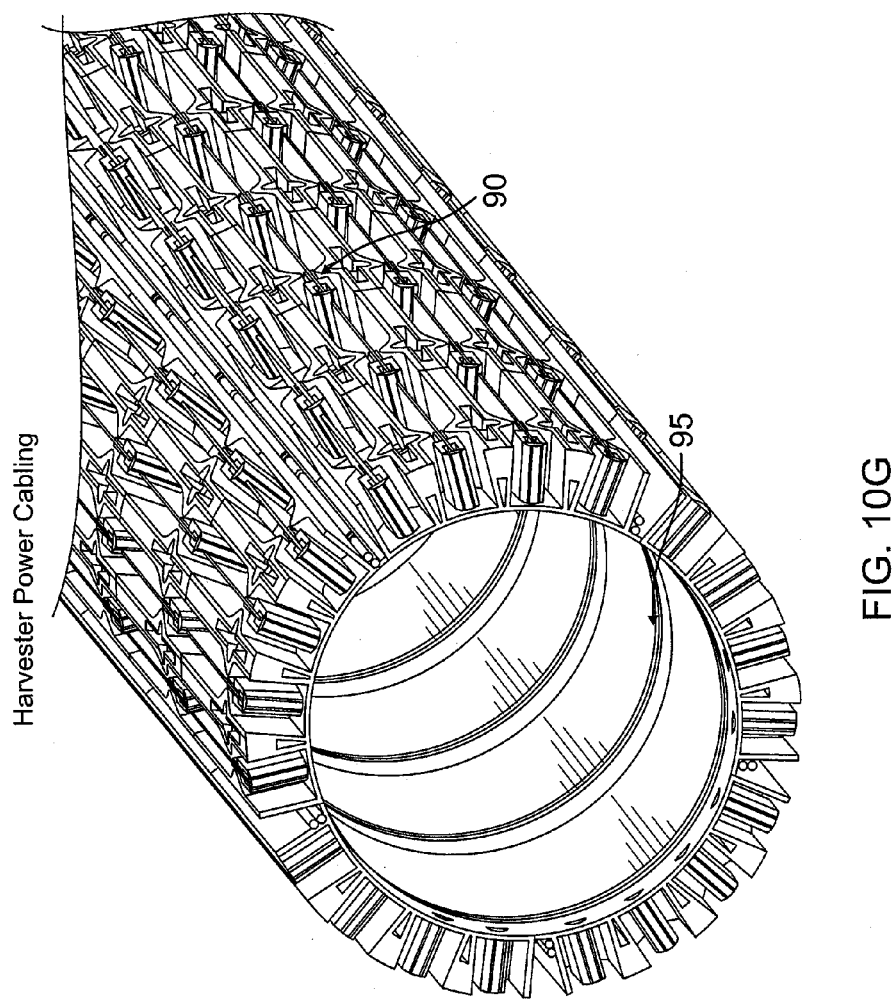

DIMENSIONS, PARAMETERS, FLOW DATA, AND RANGES FOR
EMBODIMENTS OF THE FLOW ENERGY HARVESTER

| BIMORPH ACTUATOR | LENGTH (mm) | WIDTH (mm) | THICKNESS (mm) |
|---|---|---|---|
| Actuator 1 | 49 | 1.8 | 0.6 |
| Actuator 2 | 54 | 6.4 | 1.8 |
| Actuator 3 | 84.1 | 16.8 | 0.8 |
| Actuator Min | 10 | 1 | 0.2 |
| Actuator Max | 300 | 75 | 6 |

| SPLINE NOZZLE | MIN | MAX |
|---|---|---|
| Length of Inlet (mm) | 5 | 150 |
| Cross-Sectional Area of Inlet or Outlet (mm$^2$) | 5 | 1000 |
| Approximate Entry Angle into Throat Constriction (Degrees) | 20 | 180 |
| Approximate Exit Angle into Throat Constriction (Degrees) | 5 | 90 |
| Cross sectional Area of Throat Constriction (mm$^2$) | 2 | 30 |
| Length of Outlet (mm) | 10 | 300 |

| FLOW RATES & DATA | Min | Max | Example 1 - Min | Example 1 - Max |
|---|---|---|---|---|
| Volumetric Flow Rate (LPM) | 0.25 | 30 | 1 | 14 |
| Flow Velocities at Throat Constriction (m/s) | 0.5 | 60 | 2 | 22 |
| Pressure Drop Across Single Energy Harvester (PSI) | 0 | 500 | 0 | 100 |
| Frequency of Actuator Vibration (Hz) | 50 | 1000 | -- | -- |
| Number of Devices to Be Arrayed in System Design (within a pipe with a 1m section) | 25 | 200 | -- | -- |

FLOW ENERGY PIEZOELECTRIC BIMORPH NOZZLE HARVESTER

CROSS-REFERENCE TO RELATED APPLICATION

This application claims priority to and the benefit of U.S. Provisional Application No. 61/815,647, filed with the U.S. Patent and Trademark Office on Apr. 24, 2013, the entire content of which is incorporated herein by reference.

STATEMENT REGARDING FEDERALLY SPONSORED RESEARCH OR DEVELOPMENT

The invention described herein was made in the performance of work under a National Aeronautics and Space Administration (NASA) contract, and is subject to the provisions of Public Law 96-517 (35 U.S.C. §202) in which the Contractor has elected to retain title.

BACKGROUND

1. Field

Aspects of the present invention relate generally to energy harvesting, and more specifically, to a flow energy piezoelectric bimorph nozzle harvester.

2. Description of the Related Art

Operation of electronics, sensors, or actuators down hole in oil producing wells, or other deep well operations, is difficult, expensive, and generally requires power to be transmitted down hole in a production zone. Transmitting generated power down hole is further complicated by difficulty in transmitting the power to flow past production packers. While in the alternative, power may instead be generated down hole in lieu of being transmitted, with use of rotating turbo-machinery, this type of power generation device is subject to erosion or a short life-cycle. Thus, the operating and replacement costs of existing down hole power generation devices make them difficult, complex, and expensive to operate and maintain.

SUMMARY

Aspects of the present invention relate generally to energy harvesting, and more specifically, to a flow energy harvesting apparatus integrated along a pipe or pipe sleeve or casing and utilizing a vibrating piezoelectric element or structure in such a way as to locally create energy produced from the flow for harvesting, for example, for use down hole in a deep well operation. Power can be produced locally using the flow energy harvesting device according to aspects of the present invention, thus eliminating the need to transmit power down hole to power sensors and actuators and, thus, reducing the overall complexity and difficulty of bringing power down hole.

According to an embodiment of the present, a flow energy harvesting device having a harvester pipe including a flow inlet that receives flow from a primary pipe, a flow outlet that returns the flow into the primary pipe, and a flow diverter within the harvester pipe having an inlet section coupled to the flow inlet, a flow constriction section coupled to the inlet section and positioned at a midpoint of the harvester pipe and having a spline shape with a substantially reduced opening size at a constriction point along the spline shape, and an outlet section coupled to the constriction section. The harvester pipe may further include a piezoelectric structure extending from the inlet section through the constriction section and point such that the fluid flow past the constriction point results in oscillatory pressure amplitude inducing vibrations in the piezoelectric structure sufficient to cause a direct piezoelectric effect and to generate electrical power for harvesting.

According to an embodiment of the present invention, a flow energy harvesting device configured to be integrated with a fluid flow path of a primary pipe includes a harvester pipe with a flow inlet that receives flow from the primary pipe at one end and a flow outlet at a different part of the harvester pipe that returns the flow into the primary pipe, and a flow diverter fitted within the harvester pipe and coupled to the flow inlet and the flow outlet, the flow diverter being configured to redirect the fluid flow from the main pipe through the harvester pipe. The flow diverter may include an inlet section coupled to the flow inlet at a first end, a flow constriction section coupled to the inlet section and positioned at a midpoint of the harvester pipe, the flow constriction section having a spline shape with a substantially reduced flow opening size at a constriction point along the spline shape and configured to create oscillatory pressure amplitude resulting from the reduced flow opening within the harvester pipe, and an outlet section coupled to the constriction section at a first end and coupled to the flow outlet at an opposite second end, the outlet section having an opening matching a widest section of the spline shape at the constriction section and configured to allow the fluid flow to exit the harvester pipe through the flow outlet. The harvester pipe may further include a piezoelectric actuator having a cantilever beam having a free end, wherein the free end extends from the inlet section in the direction of fluid flow at least through the constriction section and the constriction point such that the fluid flow past the constriction point from the inlet section induces vibrations in the free end sufficient to cause a direct piezoelectric effect in the piezoelectric actuator and to generate electrical power.

In an embodiment, the piezoelectric actuator is a bimorph.

In an embodiment, the piezoelectric material of the bimorph may be lead zirconate titanate (PZT).

In an embodiment, the flow diverter further includes a flow diverter clamp accommodated within the inlet section and positioned along a centerline of the inlet section spaced from the flow inlet such that fluid entering the harvester pipe is prevented from flowing through the flow diverter clamp and is rerouted around the flow diverter clamp in the inlet section. The piezoelectric actuator may further include an electrical connection component accommodated within the flow diverter clamp such that fluid flow is diverted around it, the electrical connection component being coupled to the cantilever beam at an end opposite to the free end such that the electrical power generated by the vibrations in the beam at the free end are transferred to and stored on an external power storage device through the electrical connection component.

In an embodiment, the piezoelectric actuator is a piezoelectric flextensional actuator having a stack of at least two beams, at least one of which is a flextensional piezoelectric beam, integrated around a cantilever adaptor beam, the cantilever adaptor beam being coupled to the beam having a free end that extends from the inlet section in the direction of fluid flow at least through the constriction section and the constriction point and being configured to undergo and transmit oscillatory vibrations to the piezoelectric flextensional actuator via the cantilever adaptor beam.

In an embodiment, the piezoelectric flextensional actuator may be lead zirconate titanate (PZT).

In an embodiment, the electrical power generated by the vibrations transferred via the cantilever adaptor beam may be further transferred to and stored on an external power storage device electrically connected to the piezoelectric flextensional actuator.

In an embodiment, the spline shape of the flow constriction section may include a spline having a converging opening size which narrows to a minimum in cross-sectional flow area at the constriction point and then diverges to a maximum cross-sectional flow area of the flow constriction section where it is coupled to the outlet section, creating a flow area through the constriction point designed to have flow velocity greater than 5 meters per second (m/s).

In an embodiment, the flow area through the constriction point may be designed to have flow velocity greater than 20 meters per second (m/s).

In an embodiment, the piezoelectric actuator may be a piezoelectric unimorph actuator.

In an embodiment, the harvester pipe may be a planar pipe.

In an embodiment, the harvester pipe may be a circular pipe.

In an embodiment, the flow energy harvesting device may be configured to be integrated with the fluid flow path in an oil well production casing within a circumferential region surrounding an outer diameter of an inner pipe.

In an embodiment, the flow constriction section may include a pair of flow constrictor inserts positioned closer to the end of the harvester pipe at the outlet section, each flow constrictor insert having a cubic or higher order spline shape that is a mirror image of the other such that the pair of flow constrictors creates the flow constriction point at the midpoint of the harvester pipe having the substantially reduced opening size.

According to another embodiment of the present invention, a flow energy harvesting system configured to be integrated with a fluid flow path of a primary pipe includes a primary pipe having an inner diameter and an outer diameter, a casing positioned around the outer diameter of the primary pipe and annularly spaced from the primary pipe, the annular area between the primary pipe and the casing being subject to a fluid flow, and a plurality of flow energy harvesting devices positioned around the outer diameter of the primary pipe between the casing and the primary pipe, the plurality of flow energy harvesting devices having a clearance from the casing. Each flow energy harvesting device of the plurality of flow energy harvesting devices may be connected in series and/or in parallel to adjacent flow energy harvesting devices of the plurality of flow energy harvesting devices such that a power output of the flow energy harvesting system is derived from the plurality of flow energy harvesting devices.

In an embodiment, each flow energy harvesting device of the plurality of flow energy harvesting devices may include a harvester pipe having a flow inlet that receives flow from the annular area around the primary pipe at one end and a flow outlet at a different part of the harvester pipe that returns the flow into the annular area, and a flow diverter fitted within the harvester pipe and coupled to the flow inlet and the flow outlet, the flow diverter being configured to redirect the fluid flow from the main pipe through the harvester pipe and having an inlet section coupled to the flow inlet at a first end, a flow constriction section coupled to a second end of the inlet section and positioned at a midpoint of the harvester pipe, the flow constriction section having a spline shape with a substantially reduced flow opening size at a constriction point along the spline shape and configured to create oscillatory pressure amplitude resulting from the reduced flow opening within the harvester pipe. The flow diverter of each harvester pipe may further include an outlet section coupled to the constriction section at a first end and coupled to the flow outlet at an opposite second end, the outlet section having an opening matching a widest section of the spline shape at the constriction section and configured to allow the fluid flow to exit the harvester pipe through the flow outlet. Each harvester pipe may further include a piezoelectric element having a cantilever beam having a free end, wherein the free end extends from the inlet section in the direction of fluid flow at least through the constriction section and the constriction point such that the fluid flow past the constriction point from the inlet section induces vibrations in the free end sufficient to cause a direct piezoelectric effect in the piezoelectric element and to generate electrical power.

In an embodiment, the piezoelectric element may be a lead zirconate titanate (PZT) bimorph.

In an embodiment, the plurality of flow energy harvesting devices may be positioned around the outer diameter of the primary pipe between the casing and the primary pipe in wedges and sections. Each wedge may include a plurality of flow energy harvesting devices positioned side by side around the outer diameter of the primary pipe and connected in series or in parallel to each adjacent flow energy harvesting device. Each section may include at least two wedges, each including a plurality of flow energy harvesting devices positioned side by side around the outer perimeter of the primary pipe. The flow energy harvesting system may include at least one section, each section being lined up along a length of the primary pipe with the flow energy harvesting devices each aligned and connected with the respective flow energy harvesting device in the adjacent section.

In an embodiment, the primary pipe may have an outer diameter ranging from approximately 2.875 inches to approximately 9 inches and the casing may have an inner diameter ranging from approximately 5.375 inches to approximately 9.5 inches In an embodiment, each flow energy harvesting device may be less than or equal to 4 inches in length, less than or equal to 1 inch in width, and less than or equal to 1 inch in thickness, and may produce at least 1 milliwatt (mW) of power.

BRIEF DESCRIPTION OF THE DRAWINGS

These and other features and advantages of embodiments of the present invention will become more apparent by reference to the following detailed description when considered in conjunction with the following drawings. In the drawings, like reference numerals are used throughout the figures to reference like features and components. The figures are not necessarily drawn to scale.

FIGS. 8A-8G are schematic diagrams illustrating a flow energy harvesting device having a spline flow constriction section and an in-flow piezoelectric bimorph actuator, and the various components of the flow energy harvesting device, according to an embodiment.

FIGS. 10A-10H and 10J are schematic diagrams illustrating a flow energy harvesting system including an array of flow energy harvesting devices integrated within an annular fluid flow path of a primary pipe, and the various components of the flow energy harvesting system, according to an embodiment.

FIG. 12 is a chart including dimensions for the flow energy harvesting device having the spline flow constriction section and piezoelectric bimorph actuator according to the embodiment illustrated in FIG. 11.

DETAILED DESCRIPTION

Figure 1:
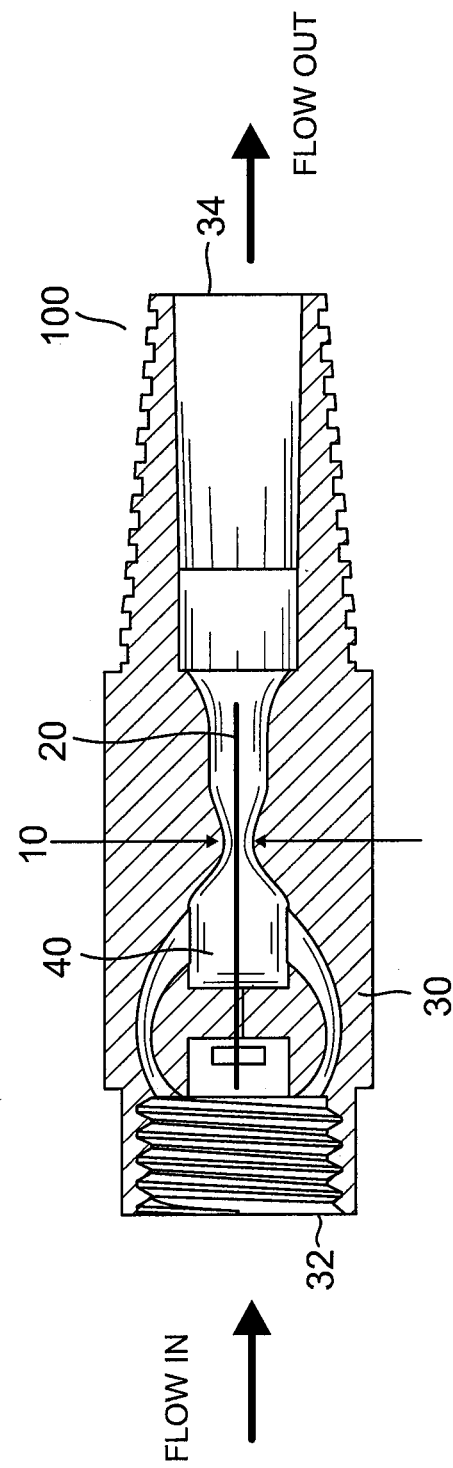
FIG. 1 is a schematic diagram illustrating a flow energy harvester according to an embodiment.

The detailed description set forth below in connection with the accompanying drawings is intended as a description of embodiments of a flow energy harvesting device, as provided in accordance with the present invention, and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like reference numbers are intended to indicate like elements or features. Moreover, the sizes of the layers and regions in the drawings may be exaggerated for convenience of explanation.

Embodiments of the present invention, as shown in FIG. 1, for example, are directed toward the use of nozzles and/or flow cavities or constrictors 40 (hereinafter referred to interchangeably as "nozzle(s)," "flow cavities," "constrictor(s)," and/or "constriction section(s)," 40) along a pipe 510 or pipe sleeve or casing 520 to produce flow conditions that excite a vibrating piezoelectric element or structure 20 in such a way as to enable conversion of energy produced from the flow into useable or storable electrical power for local use, for example, down hole in a deep well operation. In order to enable this energy conversion, in these embodiments, the frequency content of the unsteady flow must be manipulated to match the resonant frequency of the vibrating or piezoelectric structure 20 in a closely coupled fluid-structure interaction design. In these embodiments, the use of a piezoelectric element or structure 20, unlike other forms of power producing structures, may result in an energy producing mechanism capable of operating for very long periods of time, for example, decades.

Accordingly, a flow energy harvester 100 (hereinafter referred to interchangeably as "flow energy harvester," "flow energy harvesting device(s)," and/or "FEH," 100), according to embodiments of the present invention, may overcome a principle limitation of existing technology, for example, rotating turbo-machinery power generators, which are subject to erosion or shorter life-cycles. Moreover, the use of piezoelectric elements 20, according to embodiments of the present invention, also allows for use of higher temperature materials (i.e., up to 250° C.) in production of the flow energy harvester devices 100. The piezoelectric elements or actuators 20 (hereinafter used interchangeably with "piezoelectric structure" and/or "piezoelectric element" 20), according to these embodiments, may be in the form of a bimorph 120, a unimorph, a thunder actuator, a flextensional actuator 220, a moonie actuator, etc.

In an embodiment, a flow nozzle and/or flow cavity 40 is placed within a flow energy harvester pipe 30 as a means of generating vibrations over a predetermined frequency band. The flow energy harvester pipe 30, according to this embodiment, also includes a piezoelectric element or structure 20 extending from a position within the harvester pipe upstream from the flow nozzle and/or flow cavity 40 through the flow nozzle 40, and the combination results in a vibrating piezoelectric element or structure 20 that can locally generate power. Thus, sufficient power can be produced locally, using the flow energy harvester 100 according to embodiments of the present invention, such that the need to transmit power down hole to power sensors and actuators in deep well operations, for example, may be eliminated.

The flow energy harvester 100, according to an embodiment of the present invention, integrates flow nozzles or constrictors 40 specifically designed to excite piezoelectric elements or structures 20, for example, bimorph actuators 120, over a limited frequency band to induce a direct piezoelectric effect of the piezoelectric materials of each actuator 20 at is natural resonant frequency. The alternating current (AC) pressure and displacements resulting from the direct piezoelectric effect may then be converted to useable or storable AC electricity. The fluid flow through the flow nozzle or constrictor 40, in these embodiments, induces vibrations imposing mechanical stresses or strains on the piezoelectric element or structure 20, which results in the generation of electrical power.

Referring to the embodiment illustrated in FIG. 1, the flow energy harvesting device 100 may include a harvesting pipe 30 having a nozzle or flow constriction section 40 where a fluid flow entering the flow energy harvesting device from a flow inlet experiences a reduced cross-sectional harvester pipe area through which it can pass. The flow constriction section 40, in this embodiment, may further include a flow constriction point or throat 10 (hereinafter used interchangeably) where a necking effect along a circumference or perimeter of the harvester pipe 30 is reduced down to its smallest cross-sectional area. In the embodiment shown in FIG. 1, the flow constriction point 10 is at a middle or midpoint of the harvester pipe 30. The piezoelectric actuator 20, for example a bimorph actuator 120 shown in the embodiment of FIG. 1, is positioned to extend through the flow constriction point 10 and section 40 such that the piezoelectric actuator 20 experiences an oscillatory pressure amplitude or stress resulting from the disruption in pressure flow and frequency passing through the constriction point 10 and through the harvester pipe 30, causing the piezoelectric actuator 20 to vibrate and undergo a direct piezoelectric effect to produce an energy field at its natural resonant frequency in the liquid. More specifically, as a piezoelectric actuator 20 is excited due to an oscillatory pressure or stress (T) vibrating the piezoelectric structure 20 at its natural resonant frequency, an alternating electricity or an electrical field (E) is produced via the direct piezoelectric effect, where E=g*T or E=d*(T/∈), and d is the piezoelectric charge, g is the voltage coefficient, and ∈ is the dielectric permittivity. The electricity or electrical field E that is generated may then be conditioned and stored, for example, in a battery, a supercapacitor, or via delivery to a power conditioning circuitry device, for example, a rectifier circuit or a capacitance device, and then to a DC to DC amplifier, etc.

The natural frequency of the piezoelectric element or structure 20 in a fluid, according to embodiments of the present invention, can be calculated from impedance measurements as a function of frequency. In order to calculate the approximate resonant frequencies to properly scale and design the flow nozzle or constrictor 40, equations governing piezoelectric actuators 20 and non-dimensional analysis using the Buckingham Pi Theory can be used as a guide. The scale and design of the flow nozzle or constrictor 40 can be more precisely honed or tuned using Computational Fluid Dynamics (CFD) simulations, in certain instances.

Figure 2:
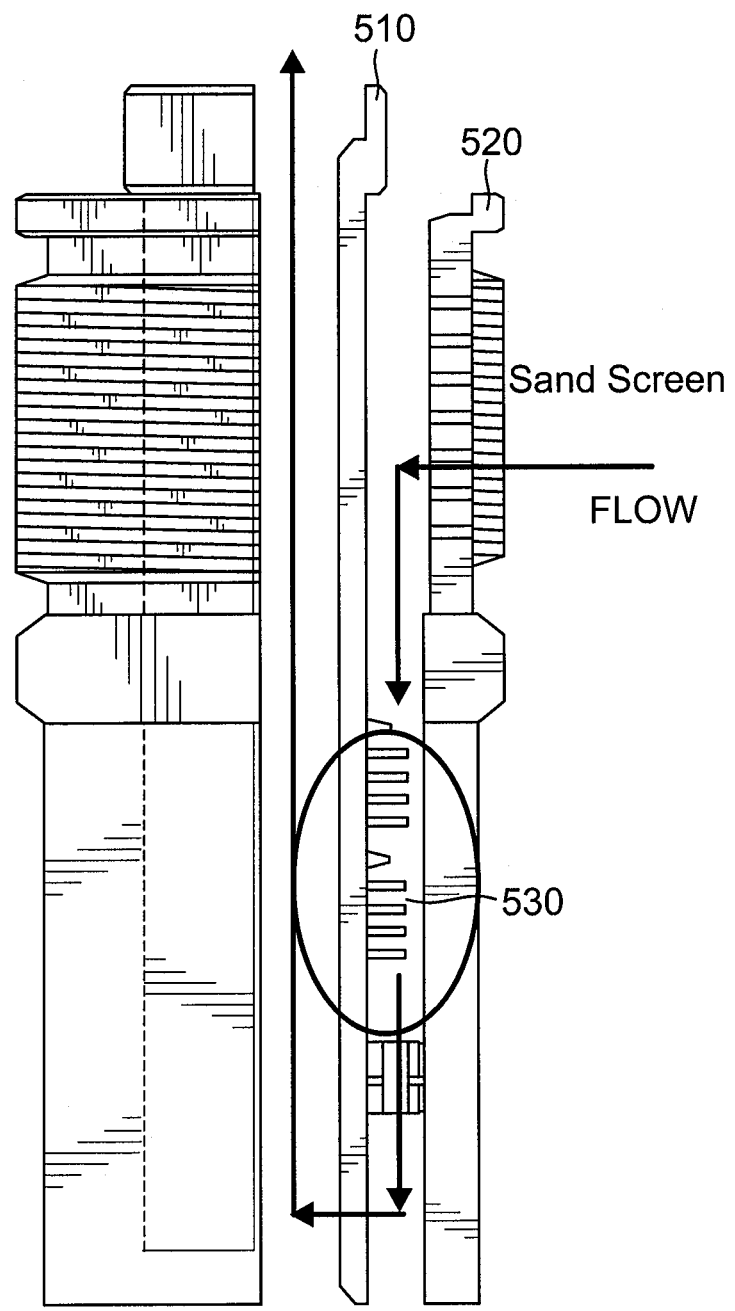
FIG. 2 is a schematic diagram of an array of flow energy harvesters positioned in a circumferential or annular region between a well casing and a pipe.

With continued reference to FIG. 1 and with reference to the embodiment illustrated in FIG. 2, a piezoelectric actuator 20 or an FEH device 100 having a piezoelectric actuator 20 element may be positioned within and integrated with a fluid flow through a circumferential or annular region around an oil or other deep well or pipe 510 within a production sleeve or casing 520. In the embodiment illustrated in FIG. 2, an array of piezoelectric actuators 20, for example, bimorph actuators 120 or unimorph actuators, may be positioned in the circumferential or annular region around an oil or other deep well or pipe 510 within the production sleeve or casing 520, either on an outer diameter of the well or pipe 510 or on an inner diameter of the sleeve or casing 520, creating flow constriction sections 540 affecting the fluid flow through the sleeve 520. The fluid flow through the flow constriction sections 540 past these piezoelectric actuators 20 creates an oscillatory motion at a frequency determined and controlled by a length, mass, and stiffness of the piezoelectric actuators 520 as well as the density, viscosity, and velocity of the fluid and flow. The oscillatory motion, according to this embodiment, produces an electric field via the direct piezoelectric effect as each of these piezoelectric actuators 20 is excited by the oscillatory vibrations, and the resulting locally generated electricity may be transferred to a storage device, for example a battery, a supercapacitor, a power conditioning circuitry device such a rectifier circuit or a capacitance device, a DC to DC amplifier, etc., or the generated electricity may be immediately used to perform various functions, for example, to open and shut valves in the production zone of the deep well operation, or to provide the power to perform other tasks down hole.

With continued reference to FIGS. 1 and 2, the conditions in the production zone of an oil well or other deep well or pipe 510 are generally extreme. For example, the static pressure in the production zone of an oil well can be greater than 25,000 pounds-square-inch (psi) and temperature can reach 160° C. or higher. Moreover, the oil produced in these oil wells or pipes 510 can contain an abrasive fine grit and can flow as fast as 50 feet per second (ft/s) or 15 meters/second (m/s). The mechanical power in the fluid flow associated with this high flow rate of 50 ft/s or 15 m/s can be calculated using the following equation:

$$P_f = \frac{dE}{dt} = \frac{1}{2}\rho v^3 A = \frac{1}{2A}\rho Q^3,$$

where E is the kinetic energy, t is the time, p is the density, A is the cross sectional area of the pipe, v is the fluid velocity, and Q is the flow rate (where Q=v*A). In an embodiment according to the present invention, ignoring any fluid compression effects, oil, having a flow rate of 15 m/s, a density of 900 kilograms per cubic meter (kg/m$^3$) in a 4 inch diameter pipe, may generate mechanical power P equal to 12.5 kilowatts (kW) of power flowing across the cross sectional area of the pipe. Since the mechanical power P is proportional to the cube of the velocity, 3% of the mechanical power can be extracted with only a reduction of 1% in the velocity, according to an embodiment. Accordingly, extracting useful mechanical power on the order of 10 Watts, for example, may be accomplished, without noticeably impeding the flow rate or velocity of the oil, according to this embodiment.

In embodiments of the present invention, design of the flow energy harvesting device 100 is also dependent on the desired electrical power output of the piezoelectric actuator. Electrical power of the piezoelectric actuator 20, according to some embodiments, can be calculated using the following formula: $P_{ev}=(\frac{1}{4})k^2\eta\rho v^3 A$, where k is electromechanical coupling of the vibrating mode of the piezoelectric, η is the conversion efficiency of the power in the fluid flow to power in the vibrating structure, ρ is the density, A is the cross sectional area of the pipe, and v is the fluid velocity of the fluid flow. In these embodiments, power $P_f$ flowing through the pipe with the cross-sectional area A can be calculated using the formula $P_f=(\frac{1}{2})\rho v^3 A$, and power in the vibrating structure $P_v$ can be calculated using the formula $P_v=(\frac{1}{2})\eta\rho v^3 A$, where electrical power $P_{ev}$ in the piezoelectric actuator 20 is equal to $k^2 P_v$, or $P_{ev}=(\frac{1}{2})k^2\eta\rho v^3 A$, except where an impedance of load $Z_1$ is set to equal an impedance load of the piezoelectric actuator $Z_p$ such that the delivered power $P_{ed}$ is equal to $(\frac{1}{2})P_{ev}$, arriving at the formula for calculating the electrical power output of the piezoelectric actuator, $P_{ev}=(\frac{1}{4})k^2\eta\rho v^3 A$.

Mechanical power or energy can be converted into electrical energy through various transduction mechanisms, such as piezoelectric, electromagnetic, and/or electrostatic mechanisms. Piezoelectric mechanisms have been the mainstay for energy harvesting systems due to their high electromechanical coupling and solid state nature (i.e., no bearings or bushings required). Energy conversion efficiency from mechanical into electrical energy or vice versa may be defined by the square of the electromechanical coupling factor k. The electromechanical coupling factor k may serve as an indicator of the effectiveness with which the piezoelectric material is converting mechanical into electrical energy or electrical into mechanical energy. The electromechanical coupling factor k is often denoted with two subscripts, where the first subscript refers to the direction along which electrodes are applied, and the second subscript refers to the direction along which mechanical energy is applied or created. Due to a high anisotropy in piezoelectric properties, piezoelectric transducers or actuators 20 have different values for the electromechanical coupling factor k depending on the mode of vibration. Accordingly, optimum transducer or actuator 20 design is vital for converting the mechanical energy $U_m$, to a maximal electrical energy $U_E$, where $U_E = k^2 U_m$. In an embodiment, for example as shown in FIG. 1, where the piezoelectric actuator 20 is a bimorph 20, the electromechanical coupling factor is a $k_{31}$ coupling device, the electrical power generated may be increased, nonetheless, by designing, for example, additional extensional $k_{33}$ mode or shear $k_{15}$ mode transducers.

With reference now to TABLE I below, it may be evident that piezoelectric mechanisms can function over a wide temperature range, with a maximum operating temperature determined by a Curie temperature $T_C$, remaining stable under large hydrostatic pressures. One of the most widely used piezoelectric materials is in the lead zirconate titanate (PZT) family, where PZTs have high piezoelectric properties with high Curie temperatures. For example, Navy type II (PZT5A), shown in TABLE I, has a Curie temperature of 365° C. and has been used successfully under operating temperatures of up to 200° C. Other materials that may be utilized for high temperature piezoelectric mechanisms may include lead titanate, $BiScO_3$—$PbTiO_3$ (BS—PT), bismuth titanate, and/or lithium niobate; however, these materials generally have inferior piezoelectric properties or higher dielectric loss factors (tan δ) as compared with the PZT family of materials, and as is evident from TABLE I. TABLE I demonstrates the room temperature material properties of various high temperature piezoelectric materials.

there does not appear to be any property degradation up to a temperature of 400° C., meaning, a wide variety of high temperature transducers and actuators 20 may be manufactured from these and other materials depicting similar properties.

Figure 3A:
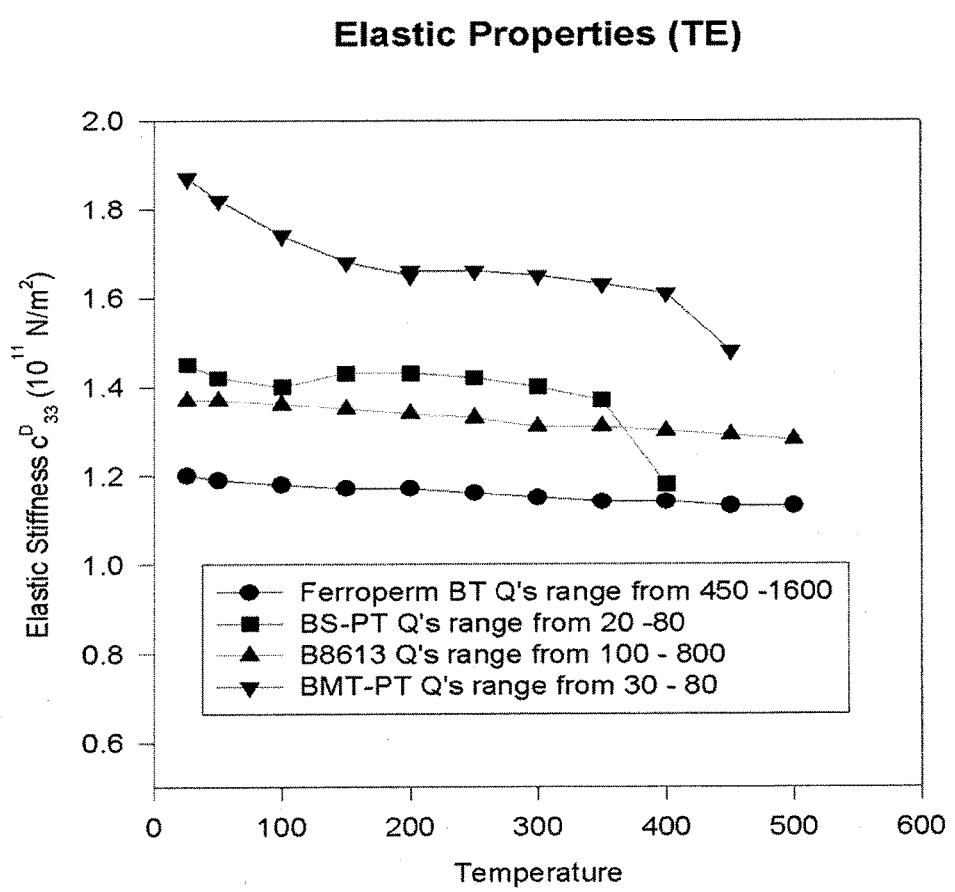
FIGS. 3A-3C show a series of graphs depicting the elastic, piezoelectric, and electromechanical properties of four different piezoelectric materials as a function of temperature.
Figure 3B:
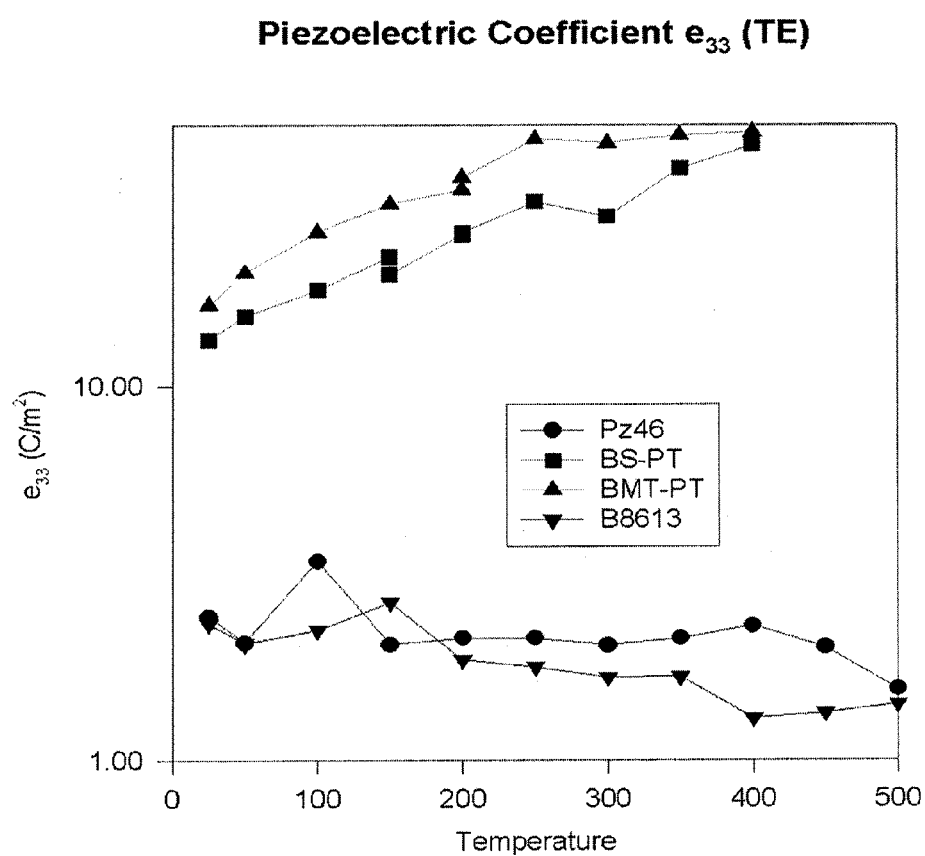
Figure 3C:
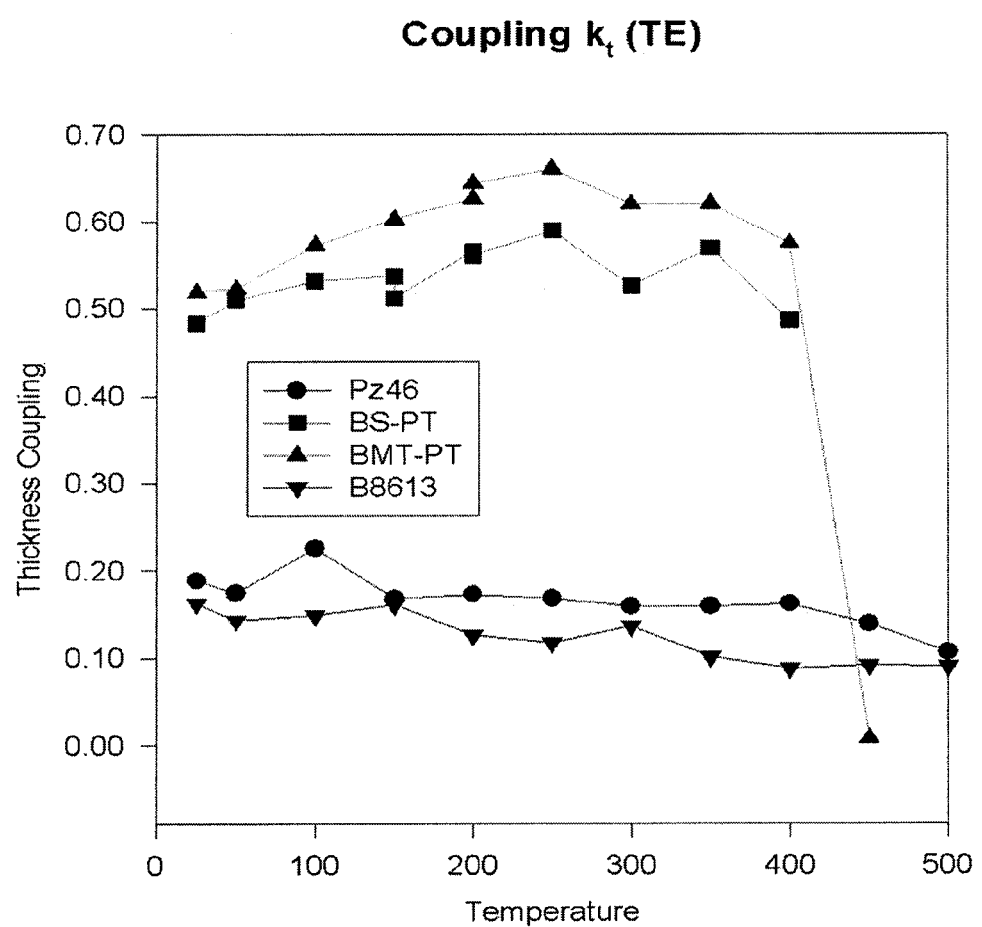

Thus, as shown in the graphs in FIGS. 3A-3C, a variety of piezoelectric materials may be utilized to manufacture the piezoelectric actuator 20, according to the embodiments of the present invention. In an embodiment, the piezoelectric actuator 20 is a bimorph actuator 120. In other embodiments, however, the piezoelectric actuator 20 may be made of any of a variety of piezoelectric materials that can be used in temperatures up to 160° C., and, as illustrated in FIGS. 3A-3C, these piezoelectric materials can remain functionally operational under high temperature conditions reaching up to 400° C. With reference back to the embodiment shown in FIG. 1, the piezoelectric actuator 20 may include a cantilever beam system 122 including a cantilever beam 124 having two piezoelectric layers 126 (i.e., a bimorph 120), as shown in the embodiment in FIG. 8B, for example. The piezoelectric bimorph 120, according to this embodiment, has a low resonant frequency such that the cantilever system 122 is more likely to match the natural frequency content of the unsteady flow created by the flow-through nozzle or cavity 40 geometry. The piezoelectric bimorph 120, according to this embodiment, also offers large amplitude of vibration for a given oscillatory force, (i.e., fluid flow), increasing the mechanical power stored in the piezoelectric bimorph 120 cantilever system 122. The piezoelectric bimorph 120 cantilever beam 124 has a tendency to vibrate at its natural frequency in the fluid. And, as the fluid flow

|  | $T_c/T_m$ (° C.) | Structure | Dielectric properties | Electromechanical coupling factors | Piezoelectric coefficients (pC/N) | Physical properties |
|---|---|---|---|---|---|---|
| PZT5A | 365 | Perovskite | $K_{33}^T$~1700, tanδ~2% | $k_t$~0.49, $k_{31}$~−0.34, $k_{33}$~0.71 | $d_{33}$~370, $d_{15}$~584 | ρ = 7.9 g/cc, $s_{33}^E$ = 18.8 pm²/N, $Q_m$ = 75 |
| Lead titanate | 400 | Perovskite | $K_{33}^T$~210, tanδ~1.4% | $k_t$~0.4, $k_{31}$~0.05, $k_{33}$~0.40 | $d_{33}$~50, $d_{15}$~40 | $s_{33}^E$~7 pm²/N, $Q_m$ > 500 |
| $BiScO_3$— $PbTiO_3$ (BS-PT) | 450 | Perovskite | $K_{33}^T$~2010, tanδ~5% | $k_t$~0.49, $k_{31}$~−0.22, $k_{33}$~0.69 | $d_{33}$~401, $d_{15}$~520 | ρ = 7.9 g/cc, $Q_m$ = 50 |
| Bismuth titanate | 650 | Bismuth layer | $K_{33}^T$~120, tanδ~0.4% | $k_t$~0.2, $k_{31}$~0.02, $k_{33}$~0.09 | $d_{33}$~18, $d_{15}$~16 | ρ = 6.55 g/cc, $s_{33}^E$~44 pm²/N, $Q_m$ > 600 |
| $LiNbO_3$ | 1150 | Corundum | $K_{33}^T$~25, tanδ~0.5% | $k_t$~0.17 (z cut), 0.49 (y/36° cut) | $d_{31}$ = −1, $d_{33}$ = 6, $d_{15}$ = 68, $d_{22}$ = 21 | ρ = 4.65 g/cc, $Q_m$ = 10,000 |

While the flow energy harvesting device 100 has been described in the embodiments above, with reference to FIG. 2, for example, for extracting energy down hole in an oil well production zone, aspects of the present invention are directed toward extracting energy in any system where the flow of oil or gas, or any fluid, is substantial, including these oil and gas pipelines. In these embodiments of the FEH 100 utilized to extract energy in any system having a substantial fluid flow, the generated energy can be used for a variety of applications, for example to power sensors, lower powered electronics, or to generate anticorrosion currents.

With reference now to FIGS. 3A-3C, various properties of the piezoelectric materials, for example, the elastic, piezoelectric, and electromechanical properties, are temperature dependent. FIGS. 3A-3C, depict these temperature dependent properties for various high temperature piezoelectric materials, for example Pz46 and B8613 bismuth titanate based materials, and BMT-PT bismuth magnesium titanate-lead titanate materials, with a piezoelectric stress constant $e_{33}$. In these examples, due to their high Curie temperatures, velocity v increases, the maximum velocity $v_t$ at the constriction point or the throat 10 ($v_t$=ω*S) must also increase to keep up with the increased flow velocity v. In order for the maximum velocity $v_t$ at the constriction point 10 to increase while still maintaining the frequency ω=2*π*f, tip displacement S of the cantilever beam 124 must increase. Accordingly, in these embodiments, the tip displacement S increases with increasing fluid flow velocity v until the tip displacement S can no longer be displaced, at which point the frequency ω of the piezoelectric bimorph 120 cantilever 124 jumps to it second mode.

Figure 4:
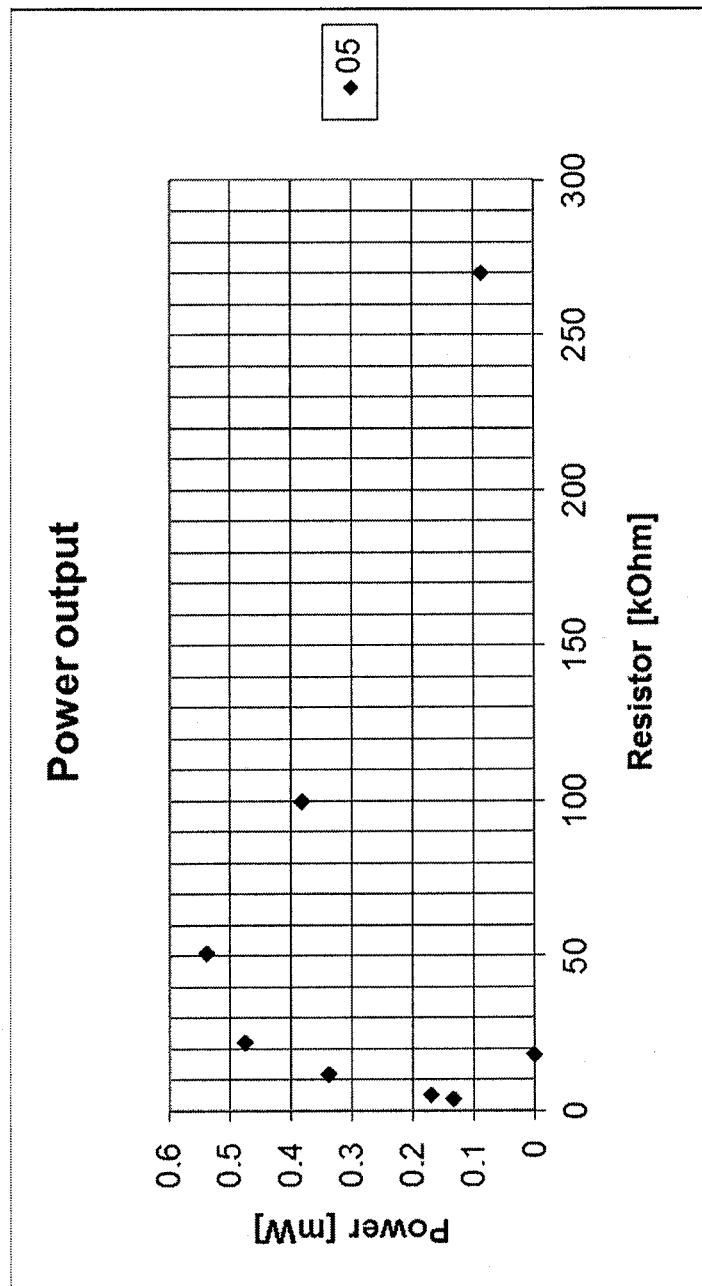
FIG. 4 is a power output graph demonstrating the power generation as a function of resistance for an example flow harvester device (FEH#5).

In an example, the results of which are depicted in the power as a function of load impedance graph illustrated in FIG. 4, a piezoelectric bimorph 120 was connected in parallel and used to demonstrate the power generation in a proof-of-concept nozzle or flow constrictor 40 flow harvesting device 100 (FEH#5), with a design based off the embodiment shown in FIG. 1, having a resonant frequency approximately equal to 110 Hertz (Hz), and capacitance equal to 25 nanofarads (nF). In this example, the piezoelectric bimorph 120 with the design based off the embodiment shown in FIG. 1, has a length of approximately 42 millimeters (mm), a width of approximately 2.5 mm, and a thickness of approximately 0.6 mm. In this embodiment, in order to achieve maximum power transfer from the source to the load, the load resistance $R_L$ should be matched to the source impedance (i.e., a piezoelectric mechanism). The electrical impedance of a piezoelectric material at off-resonance frequencies can be approximated using the formula $1/j\omega C+R_p$, where $R_p$ is the internal resistance related to the dielectric loss (i.e., tan $\delta/\omega C$, tan $\delta=2\%$), and C is the capacitance of the piezoelectric material. The nozzle or flow constrictor 40, according to the embodiment shown in FIG. 1, produced an average power of approximately 0.53 milliwatt (mW)·per FEH 100 having a piezoelectric bimorph 120, measured at a flow rate of 12 liters per minute (LPM), which was the maximum possible flow rate available for the testing apparatus use. The power generated as a function of the load resistance for the piezoelectric bimorph 120 flow constrictor 40 FEH 100, according to the embodiment shown in FIG. 1, can be found in FIG. 4, where the maximum power was achieved when the load resistance approximated 50 kiloohms (kOhm), which is close to the value of electrical impedance estimated using the formula $1/j\omega C+R_p$, or 57.8 kOhm. As illustrated in the graph in FIG. 4, maximum power of 0.53 mW was achieved at a resistance of approximately 50 KOhms, above which, power steadily decreased as load resistance increased.

Figure 5:
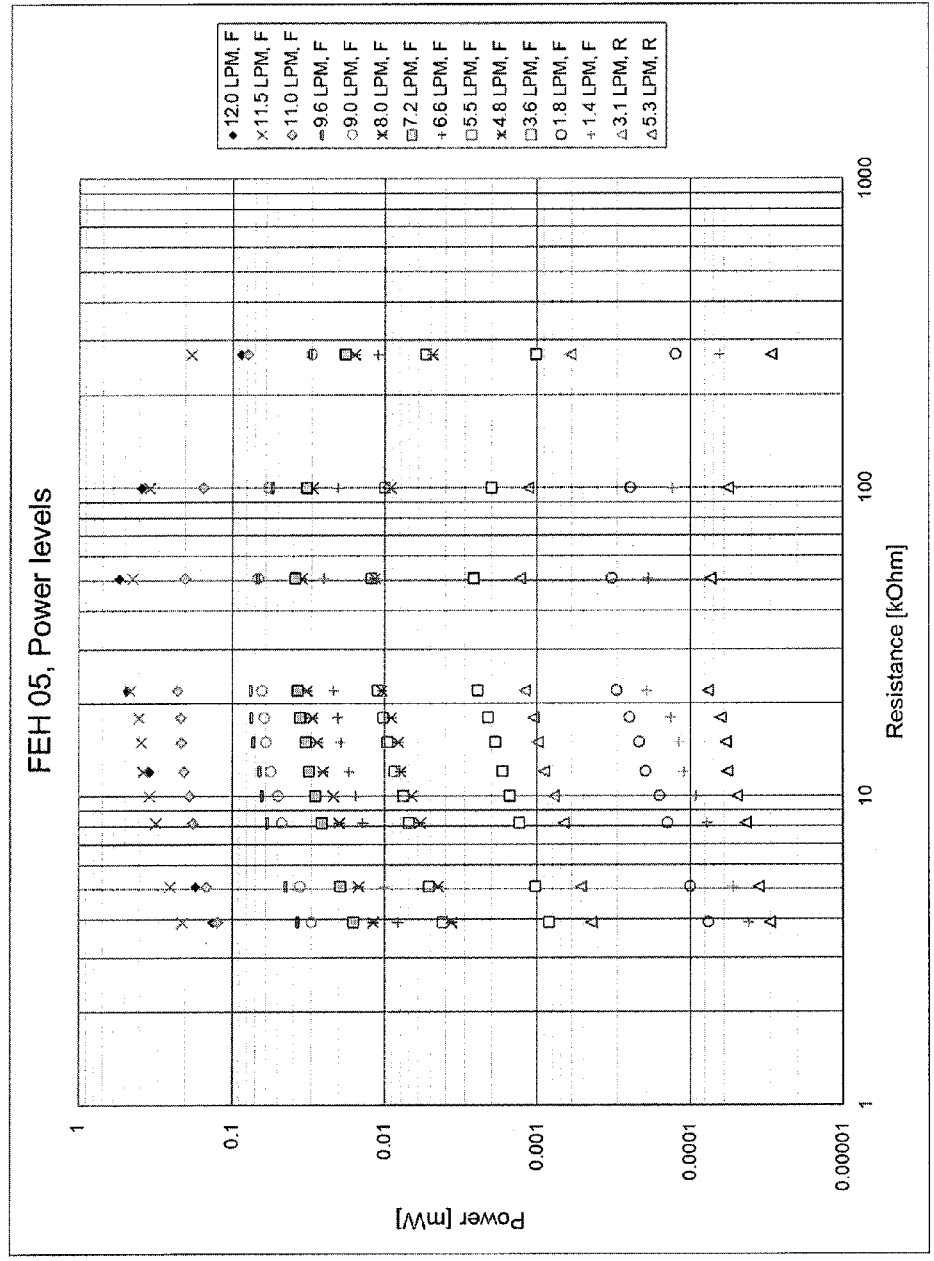
FIG. 5 is a power output graph demonstrating the power generation as a function of resistance for a second example flow harvester device (FEH 05) measured at various flow rates.

In additional examples, a variety of different nozzle or flow constrictor 40 designs were tested, based on simple flow channels. As compared with the flow nozzle or constrictor 40 shown in FIG. 1 (FEH#5), FEH#5 had power levels an order of magnitude higher than all the other simple direct flow nozzles or flow constrictors. The power generated by each of the FEH#5 type harvesting devices 100 having a flow constriction point 10 near a midpoint of the harvester pipe 30 is greater, by an order of magnitude, than any power generated by similar devices having a piezoelectric bimorph configuration. Accordingly, in order to confirm the design and results achieved from testing the FEH#5 (shown in FIG. 4), a second nozzle or flow constrictor FEH 05 was fabricated, based on the same flow channel and design as the FEH#5, and tested. FIG. 5 illustrates a graph depicting power as a function of load resistance and flow rate for the duplicate FEH#5 (FEH 05) fabricated and tested. In this example, the duplicate FEH#5 has a piezoelectric bimorph 120 with the design based off the embodiment shown in FIG. 1 with a length of approximately 42 mm, a width of approximately 2.5 mm, and a thickness of approximately 0.6 mm. FIG. 5 depicts the power curves as a function of flow rate in LPM and in the forward F and reverse R directions. The data for this example was taken from a flow from a tap with fluid exiting the device at ambient pressure. As shown in the graph of FIG. 5, the power levels reached approximately the same levels as the original FEH#5 prototype and design shown in FIG. 1. In this example and in the example shown in FIG. 4, the maximum velocity v for the FEH#5 and the FEH 05 was approximately 21 m/s at a maximum volumetric flow rate of approximately 14 LPM. In an embodiment, the fluid flow was subject to a high pressure loop of 250 psi which resulted in a power generation of up to 2.5 mW, at which the FEH 100 became unstable and the piezoelectric bimorph 120 showed signs of degradation.

With continued reference to FIG. 5, each of the curves depicted in the graph provides a range of velocities v for the FEH 05 device. For example, 12 LPM corresponds to a velocity v of 21 m/s. In the example shown in FIG. 5, the lowest flow rate in the forward F direction to produce measurable power output results was 1.4 LPM which corresponds to a velocity v of approximately 2.45 m/s (where v=(21 m/s at 12 LPM)*(1.4 LPM/12 LPM)). In these examples, the velocity in the flow constriction section 40 and the flow rate are directly linearly related through the flow area of the constriction point 10 such that as the flow rate increases so does the velocity, generating higher average power, as shown in FIG. 5. In embodiments of the present invention, the flow energy harvesting devices 100 can be manufacture much smaller to operate on a micro-scale such that the frequencies and vibration of the piezoelectric actuator 20 increases to a greater degree. More specifically, in other embodiments, as the substantially scaled down (micro) piezoelectric actuator 20 of the micro-FEH system is excited due to an oscillatory pressure or stress vibrating the substantially scaled down (micro) piezoelectric structure 20 at its natural resonant frequency, a much greater relative alternating electricity or an electrical field (E) can be produced via the direct piezoelectric effect on these micro-FEH systems.

Figure 6:
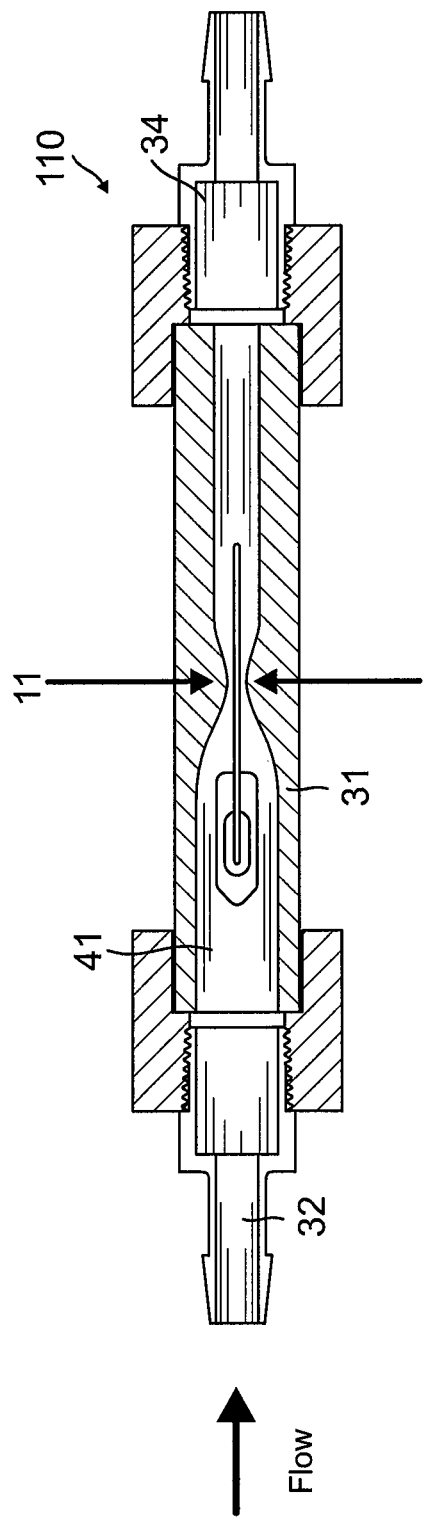
FIG. 6 is a schematic diagram illustrating a planar flow energy harvester according to an embodiment.

Moreover, in an additional example for purposes of comparison, a planar version of the FEH#5 flow energy harvesting device 110 having a piezoelectric bimorph 120 extending through a nozzle 41 and flow constriction point 11, was manufactured, having a point of constriction 11 at a midpoint of the pipe 31, as shown schematically in FIG. 6. The planar version 110 of the FEH#5 appeared to provide similar results as the FEH#5 and its duplicate FEH 05.

Figure 7:
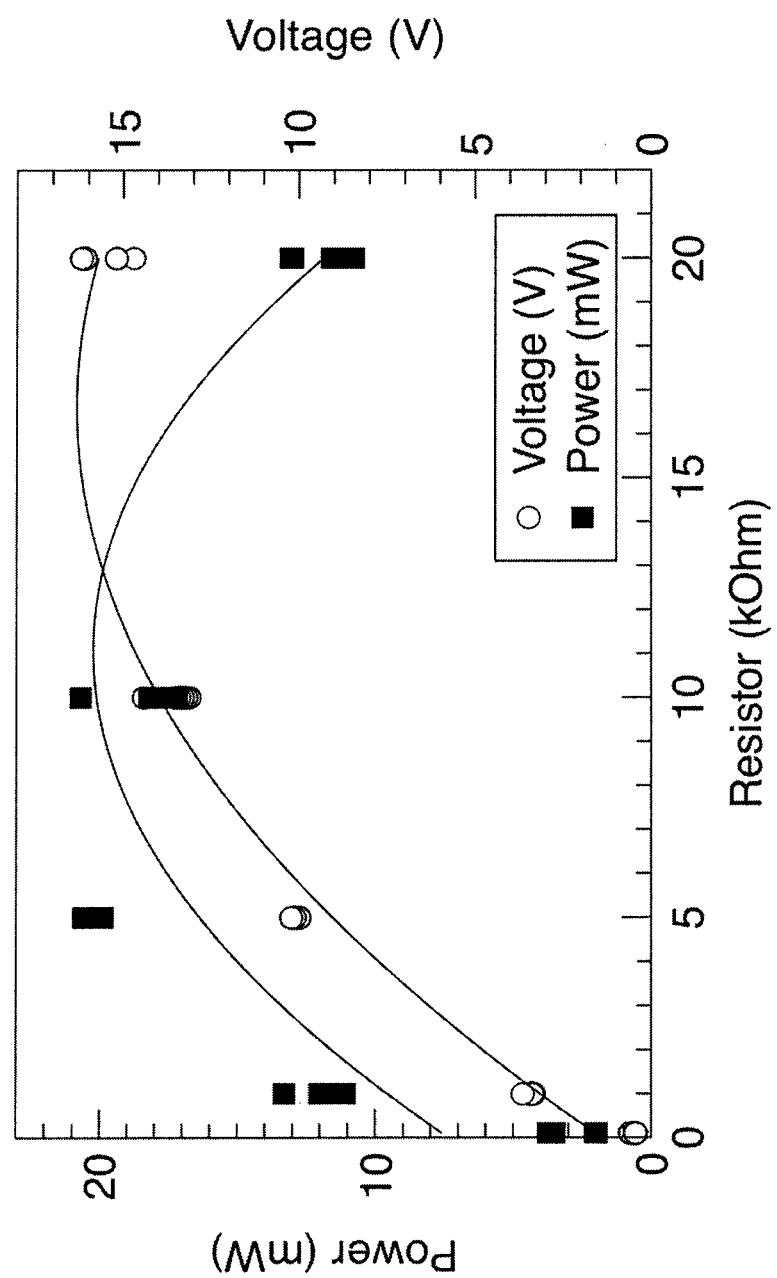
FIG. 7 is a power output graph demonstrating the power and voltage generation as a function of resistance and flow rate for a third example flow harvester device.

With reference now to FIG. 7 a power output graph demonstrating the power and voltage generation as a function of resistance and flow rate for a third example flow harvester device 100 is shown. The FEH device 100 used in this example has a piezoelectric bimorph 120 with a length of approximately 91 mm, a width of approximately 17 mm, and a thickness of approximately 0.8 mm. In this example, as shown in the graph in FIG. 7, this FEH device 100 generated a minimum power output of approximately 1 mW and a maximum power output of approximately 20 mW of stable power under a flow rate of 12 LPM. In an embodiment, an array of 100 FEH devices 110 consisting of the FEH device 100 in the example in FIG. 7 could produce up to 2 W of power.

Figure 8A:
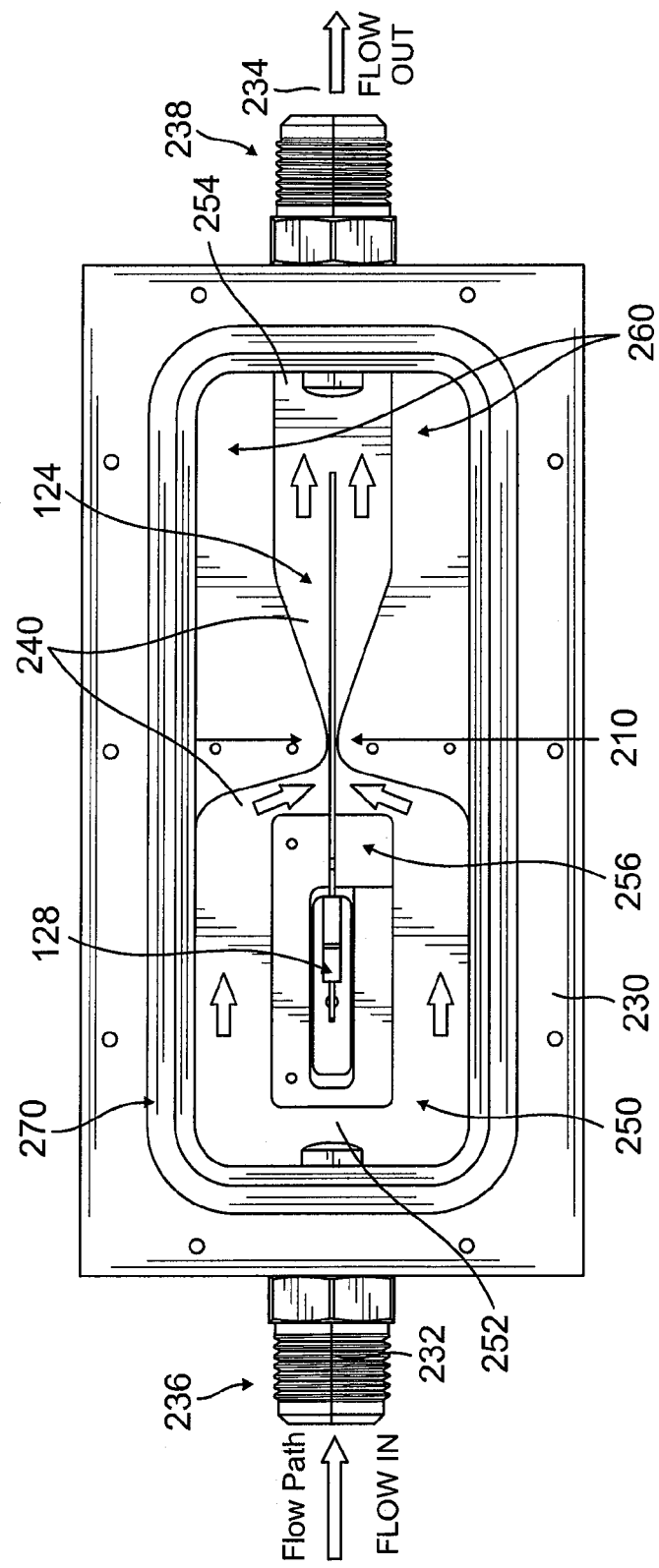

With reference now to the embodiment illustrated in FIGS. 8A-8G, a flow energy harvesting device 200 having a spline nozzle or flow constriction section 240 and an in-flow piezoelectric bimorph actuator 120 is shown. In this embodiment, the flow energy harvesting device 200 includes a harvester pipe 230 having a flow inlet 232 that receives flow from a primary pipe at one end and a flow outlet 234 at the opposite end of the harvester pipe 230 that returns the flow into the primary pipe. The flow inlet 232 may include an external fitting 230, for example a National Pipe Thread Taper (NPT) fitting coupled to the harvester pipe at the fluid inflow path location, as shown in FIGS. 8A and 8E-8G. The flow path of a fluid inflow (from an upstream direction) is indicated in FIG. 8A with arrows in the direction of flow. Similarly, the flow outlet 234 may also include an external fitting 238, for example, a NPT fitting coupled to the harvester pipe at the fluid outflow path location, as shown in FIGS. 8A and 8E-8G. The flow path of the fluid outflow (from the upstream to the downstream direction) is also indicated in FIG. 8A with the arrows in the direction of fluid flow. The fluid inlet 232 and fluid outlet 234 can be manufactured using any fitting suitable for connecting to a coupled flow harvester device 100 and/or 200, the main pipe with which the flow harvester device 200 is integrated, or any suitable connection required at each of the fluid inlet 232 and/or outlet 234 locations. The fluid inlet 232 and outlet 234 do not require a fitting 236 and/or 238 and can be internally threaded within the harvester pipe 230, or include just an opening at each end with no threading or fitting attached.

Figure 8D:
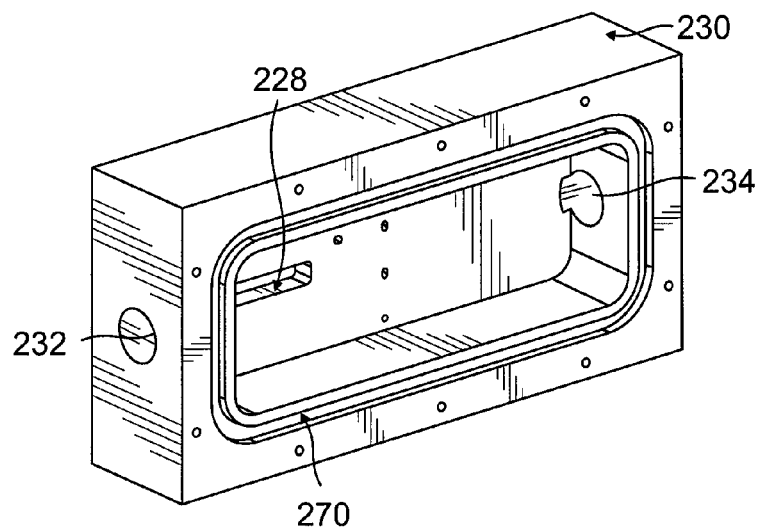
Figure 8E:
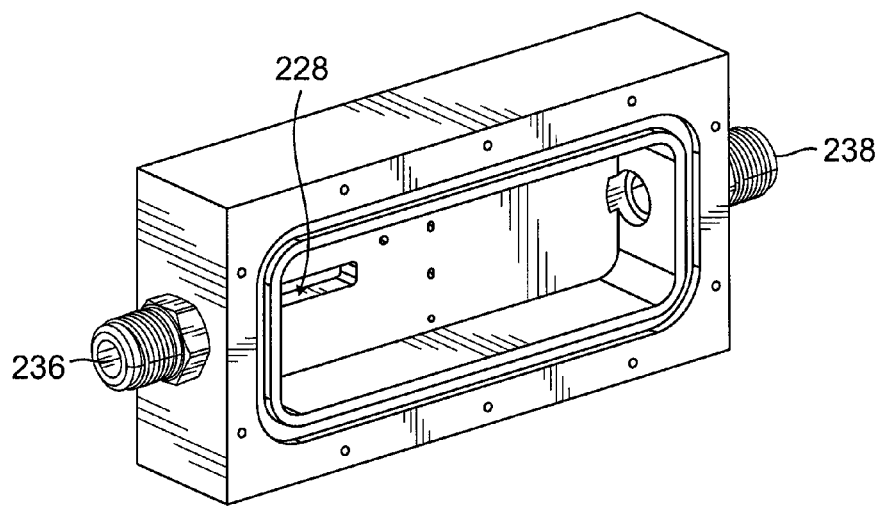
Figure 8F:
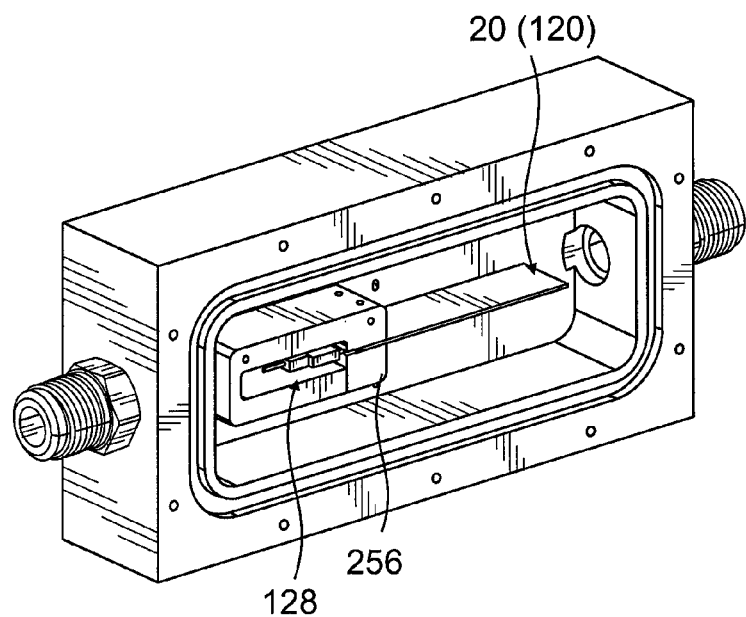
Figure 8G:
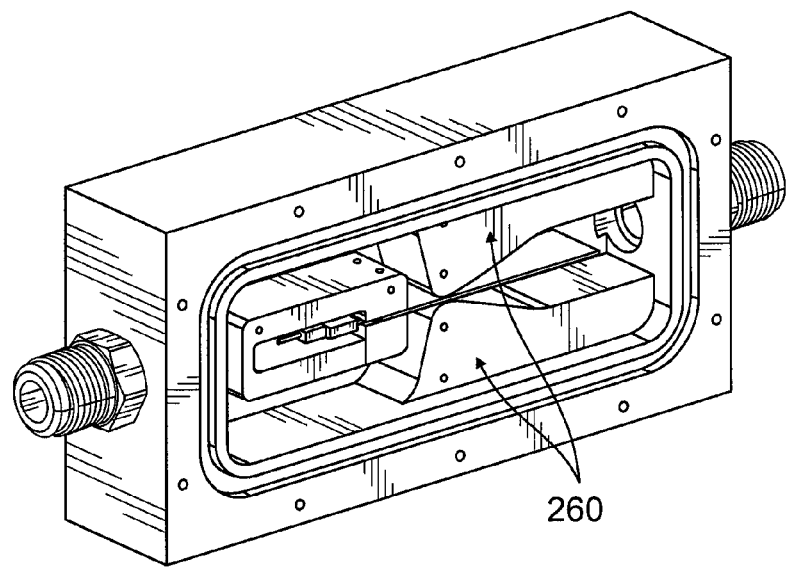

With continued reference to FIGS. 8A-8G, the harvester pipe 230 may further include a flow diverter 250 fitted within the harvester pipe 230, for example in the pipe cavity, and coupled to the flow inlet 232 at one end and the flow outlet 234 at the opposite end, as shown in FIGS. 8A and 8G. The flow diverter 250, according to an embodiment, is configured to redirect the fluid flow from the main pipe through the harvester pipe 230, as indicated by the flow path arrows in FIG. 8A. The flow diverter 250, as shown in FIGS. 8A and 8F, may include an inlet section 252 coupled to the flow inlet 232 at a first end of the harvester pipe 230. The inlet section 252, according to this embodiment, has an opening matching an interior of the harvester pipe (cavity) 230 such that the fluid can flow through the interior cross-section of the harvester pipe 230. As shown in FIGS. 8A and 8G, the harvester pipe 230 further includes a flow constriction section 240 coupled to a second end of the inlet section 252 opposite the flow inlet 232. According to the embodiment shown in FIGS. 8A and 8G, the constriction section 240 may be positioned at a midpoint of the harvester pipe 230, however the constriction section 240 is not limited to this particular embodiment, and may, instead, be positioned at an end of the harvester pipe 230 or at any location to provide desired oscillatory vibration in the fluid flow. The constriction section 240, according to the embodiment shown in FIGS. 8A and 8G has a spline shape with a substantially reduced opening size at a constriction point or a necking or bottle-neck area 210 along the spline shape. The constriction point 210, according to this embodiment, is configured to create an oscillatory pressure amplitude resulting from the reduced flow opening within the harvester pipe 230. While the constriction point 210, according to this embodiment, is positioned at a midpoint of the harvester pipe 230, it is not limited to this location, and may be placed at any location within the harvester pipe 230 to produce the desired oscillatory pressure amplitude. The constriction section 240 and point 210, according to this embodiment, are created in a spline shape such that two mirror-image spline shapes converge at a point to create the constriction point (or throat) 210, and diverge in a direction away from the constriction point 210 in a direction downstream to couple with an outlet section 254 at a first end, the outlet section 254 being coupled to the flow outlet 234 at an opposite second end, as shown in FIG. 8A. The outlet section 254, according to this embodiment, has an opening matching a widest section of the spline shape at the constriction section 240 and is configured to allow the fluid flow to exit the harvester pipe 230 through the flow outlet 234. The spline shape of the constriction section 240 as well as the outlet section 254 may be manufactured in a variety of ways, for example, using spline nozzle or constrictor inserts 260, having a cubic or higher order spline shape, as shown in the embodiment of FIGS. 8A and 8G. These inserts 260 may be symmetrical with one another, or may be asymmetrical, and include the shape of the constriction section 240 and/or point 210, functioning like a mold, blocking fluid flow from areas where the inserts 260 are positioned.

The harvester pipe 230, according to this embodiment, as shown in FIGS. 8A-8C, also includes a piezoelectric actuator 20. The piezoelectric actuator 20 may include any form or vibration mode. In the embodiment shown in FIG. 8A-8C, the piezoelectric actuator 20 is fixed within the harvester pipe 230 and includes a cantilever beam system 122 having a free end or beam 124 extending from the inlet section 252 in the direction of fluid flow at least through the constriction section 240 and the constriction point 210. The piezoelectric actuator 20, in this embodiment, is fixed in a particular position within the flow energy harvester 200 such that the fluid flow past the constriction point 210 from the inlet section 252 induces vibrations in the free end of the beam 124 sufficient to cause the direct piezoelectric effect in the piezoelectric actuator 20 and to generate electrical power. The piezoelectric actuator 20, according to the embodiment shown in FIGS. 8A-8C may be a piezoelectric bimorph 120. The bimorph 120 may be made from any piezoelectric material suitable for a bimorph 120. In one embodiment, the piezoelectric material of the bimorph 120 is lead zirconate titanate (PZT).

The piezoelectric actuator 120 according to the embodiment shown in FIGS. 8A-8C, may further include an electrical connection component 128 coupled to the cantilever beam system 122 at an end opposite to the free end of the beam 124 such that the electrical power generated by the vibrations in the beam at the free end 124 are transferred to the electrical connection component 128 which may then be connected to a battery, a supercapacitor, a power conditioning circuitry device such as a rectifier circuit or a capacitance device, a DC to DC amplifier, etc., for storing the generated power. The electrical connection component 128 of the piezoelectric actuator 20, 120, according to this embodiment, may be accommodated within a flow diverter clamp 256, as shown in FIGS. 8A, 8C, and 8F, such that fluid flow is diverted around it. The flow diverter clamp 256, according to this embodiment, may be part of the flow diverter 250 and accommodated within the inlet section 256 and positioned along a centerline of the inlet section 256 spaced from the flow inlet 232 such that fluid entering the harvester pipe 230 is prevented from flowing through the flow diverter clamp 256 and is rerouted around the flow diverter clamp 256 in the inlet section 252. As shown in FIG. 8A, the flow diverter clamp 256 forces fluid flow to reroute around the non-exposed portions of the piezoelectric actuator 20, 120, including the electrical connection component 128.

According to an embodiment, for example, as shown in FIG. 8D, the harvester pipe 230 may have cut-outs or openings 228 defined in through an exterior of the harvester pipe 230 and coupled to a location where the electrical connection component 128 and diverter clamp 256 are positioned within the harvester pipe 230. The cut-outs or openings 228, according to this embodiment, allow for any wiring or electrical components necessary to connect with the electrical connection component 128 for energy transfer and storage to be run through the harvester pipe 230 in a location protected from fluid flow.

With continued reference to FIGS. 8A and 8D, the harvester pipe 230 may also include a fluid sealing mechanism 270 surrounding an inner diameter of the harvester pipe 230. The sealing mechanism 270, for example, may be an o-ring seal to prevent any fluid from leaking out of the harvester pipe 230 around the flow path created by the flow diverter 250. The harvester pipe 230 according to the embodiment shown in FIGS. 8A-8G is a planar pipe. However, in other embodiments, the harvester pipe 230 can include any shape, for example, the harvester pipe 230 may be a circular pipe.

According to some embodiments, for example, as shown in FIGS. 8A-8G and 9A-9G, the spline shape of the flow constriction section 240, 340 may be designed to have a flow velocity greater than 5 meters per second (m/s). In another embodiment, the spline shape of the flow constriction section 240, 340 may be designed to a have flow velocity greater than 20 meters per second (m/s). The spline shape of the flow constriction section 240. 340 of the flow energy harvesting device 200, 300, according to these embodiments, may having a converging opening size which narrows to a minimum in cross-sectional flow area at the constriction point 210, 310 and then diverges to a maximum cross-sectional flow area of the flow constriction section 240, 340 where it is coupled to the outlet section 254, 354, creating a flow area through the constriction point 210, 310 designed to have flow velocity greater than 5 meters per second (m/s). In an embodiment, the flow velocity through the constriction point 210, 310 exceeds 20 m/s.

According to the embodiments shown in FIGS. 8A-8G and 9A-9G, for example, the flow energy harvesting device 200, 300 may be configured to be integrated with the fluid flow path in an oil well production casing 520 within a circumferential region surrounding an outer diameter of an inner pipe 510 (for example, as shown in FIGS. 10A-10H and 10J, and in FIG. 2).

Figure 9A:
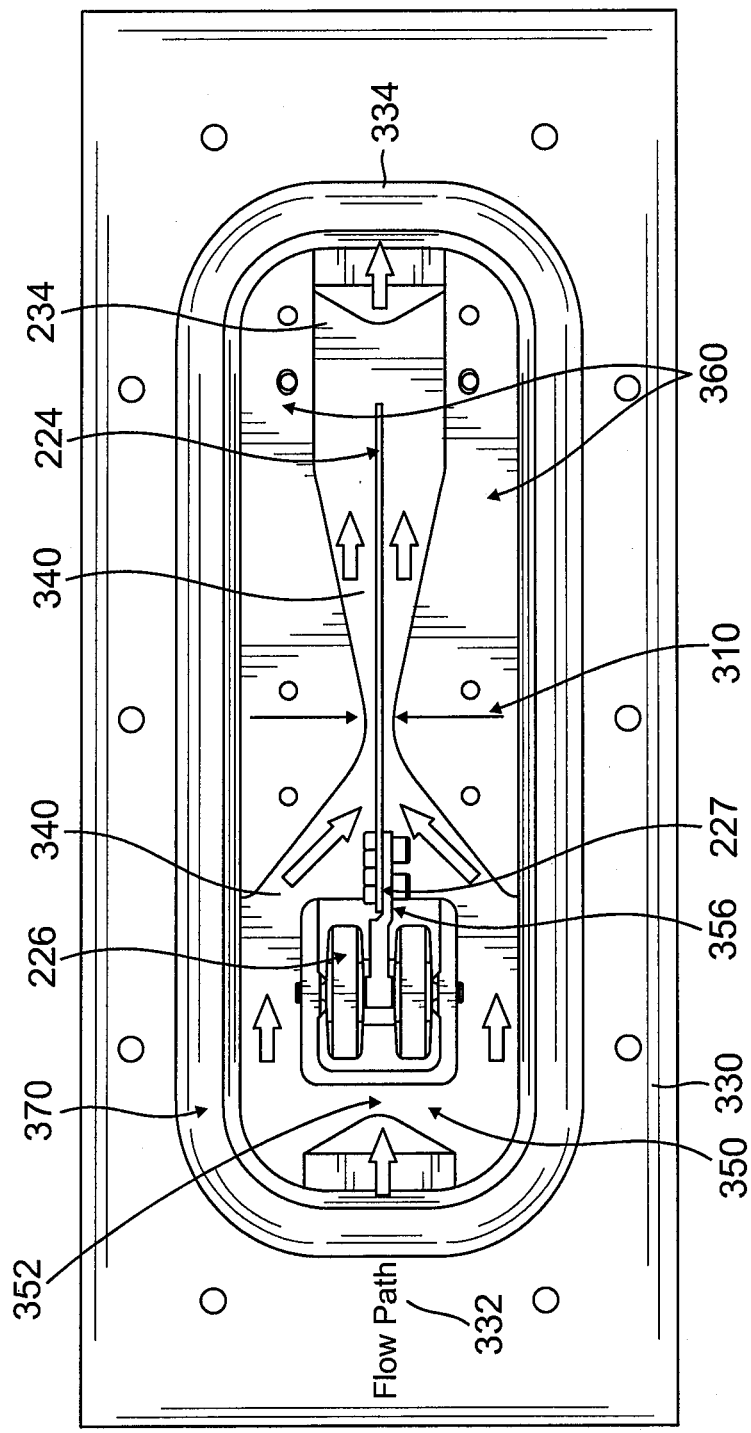
FIGS. 9A-9G are schematic diagrams illustrating a flow energy harvesting device having a spline flow constriction section and a pair of piezoelectric flextensional actuators out of flow coupled to a non-piezoelectric cantilever beam extending in-flow, and the various components of the flow energy harvesting device, according to another embodiment.
Figure 9B:
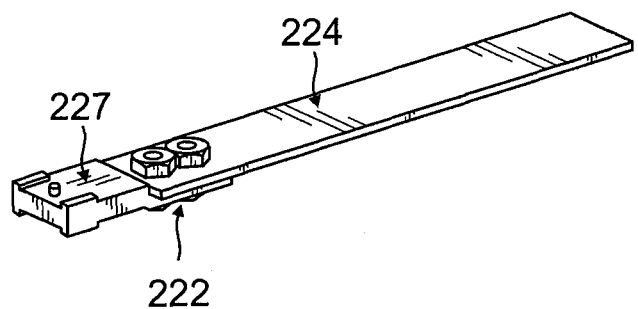
Figure 9C:
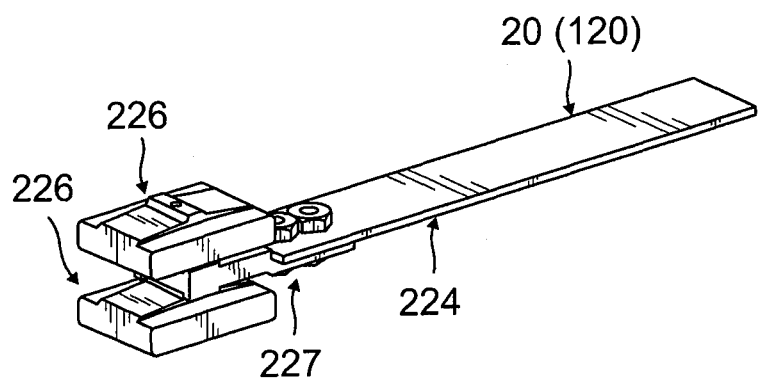
Figure 9D:
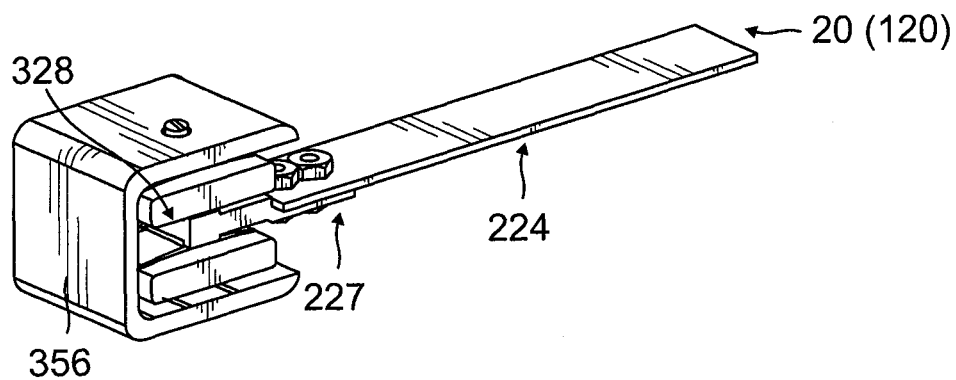
Figure 9E:
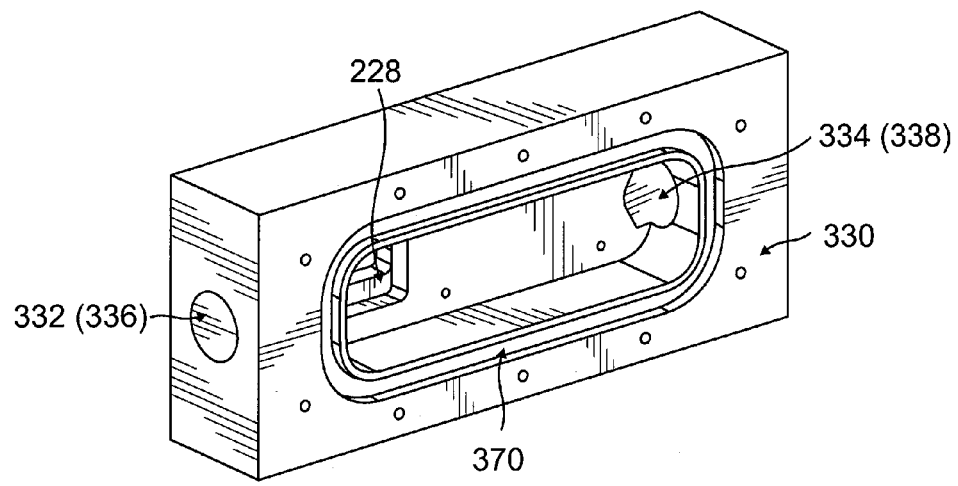
Figure 9F:
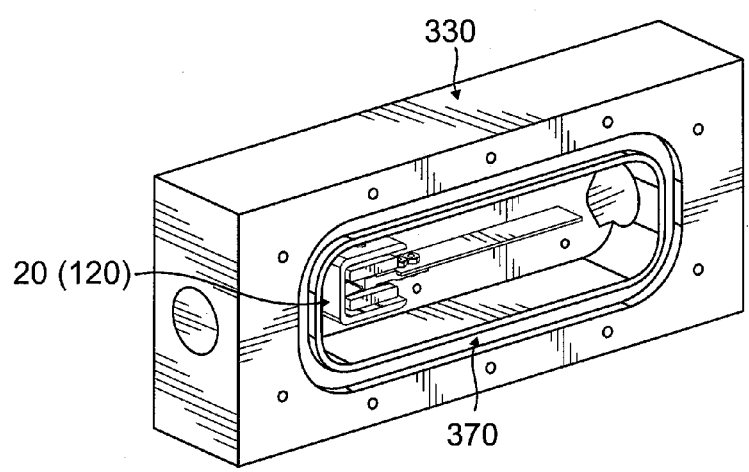
Figure 9G:
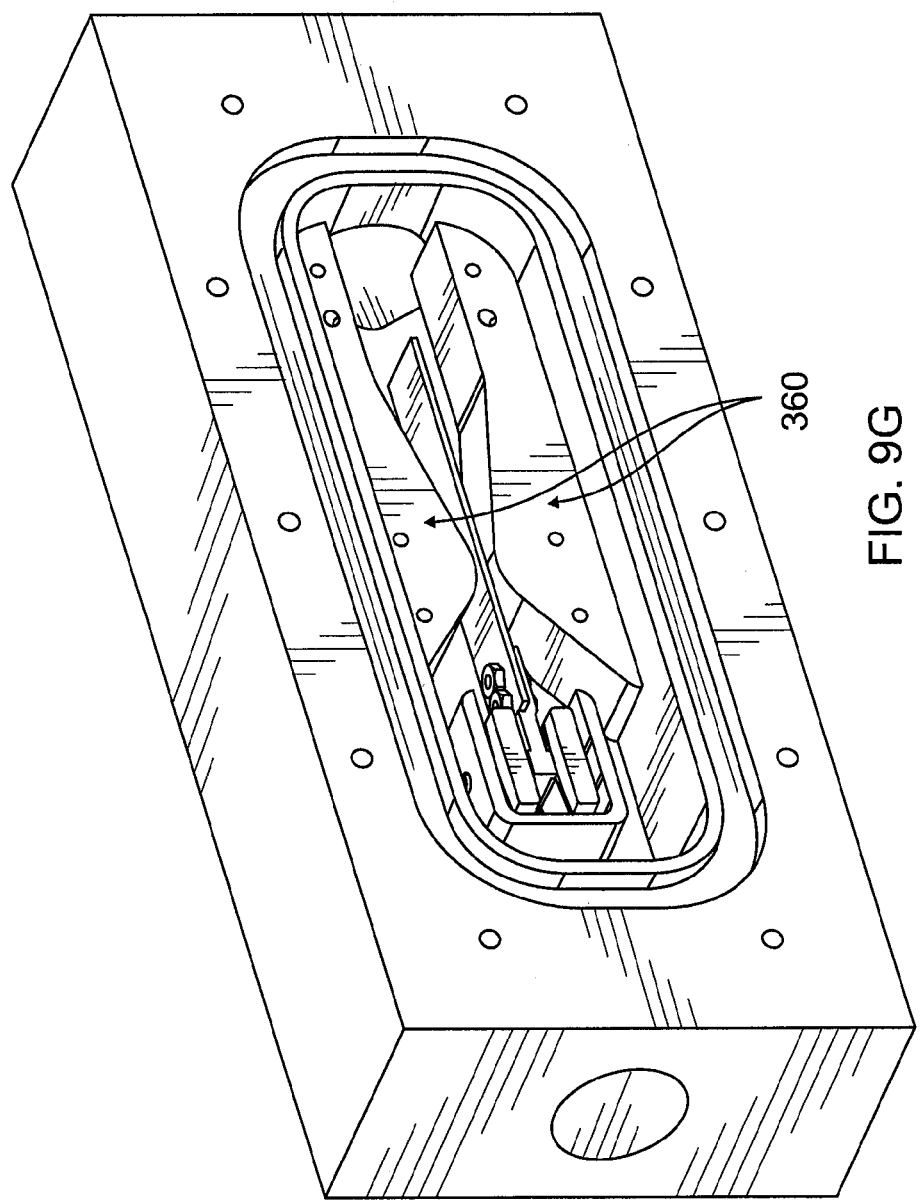

With reference now to the embodiment illustrated in FIGS. 9A-9G, a flow energy harvesting device 300 having a spline nozzle or flow constriction section 240 and a pair of piezoelectric flextensional actuators 220 out of flow coupled to a non-piezoelectric beam 224 extending in-flow is shown. In this embodiment, the flow energy harvesting device 300 includes a harvester pipe 330 having a flow inlet 332 that receives flow from a primary pipe at one end and a flow outlet 334 at the opposite end of the harvester pipe 330 that returns the flow into the primary pipe. The flow inlet 332 may include an external fitting 336, for example a NPT fitting coupled to the harvester pipe 330 at the fluid inflow path location. The flow path of a fluid inflow (from an upstream direction) is indicated in FIG. 9A with arrows in the direction of flow. Similarly, the flow outlet 334 may also include an external fitting 338, for example, a NPT fitting coupled to the harvester pipe 330 at the fluid outflow path location. The flow path of the fluid outflow (from the upstream to the downstream direction) is also indicated in FIG. 9A with the arrows in the direction of fluid flow. The fluid inlet 332 and fluid outlet 334 can be manufactured using any fitting suitable for connecting to a coupled flow harvester device 100, 300, the main pipe with which the flow harvester device 300 is integrated, or any suitable connection required at each of the fluid inlet 332 and/or outlet 334 locations. The fluid inlet 332 and outlet 334 do not require a fitting 336 and/or 338 and can be internally threaded within the harvester pipe 330, or include just an opening at each end with no threading or fitting attached, for example, as shown in FIGS. 9E-9G.

With continued reference to FIGS. 9A-9G, the harvester pipe 330 may further include a flow diverter 350 fitted within the harvester pipe 330, for example in the pipe cavity, and coupled to the flow inlet 332 at one end and the flow outlet 334 at the opposite end, as shown in FIGS. 9A and 9G. The flow diverter 350, according to an embodiment, is configured to redirect the fluid flow from the main pipe through the harvester pipe 330, as indicated by the flow path arrows in FIG. 9A. The flow diverter 350, as shown in FIGS. 9A and 9F, may include an inlet section 352 coupled to the flow inlet 332 at a first end of the harvester pipe 330. The inlet section 352, according to this embodiment, has an opening matching an interior of the harvester pipe (cavity) 330 such that the fluid can flow through the interior cross-section of the harvester pipe 330. As shown in FIGS. 9A and 9G, the harvester pipe 330 further includes a flow constriction section 340 coupled to a second end of the inlet section 352 opposite the flow inlet 332. According to the embodiment shown in FIGS. 9A and 9G, the constriction section 340 may be positioned at a midpoint of the harvester pipe 330, however the constriction section 340 is not limited to this particular embodiment, and may, instead, be positioned at an end of the harvester pipe 330 or at any location to provide desired oscillatory vibration in the fluid flow. The constriction section 340, according to the embodiment shown in FIGS. 9A and 9G has a spline shape with a substantially reduced opening size at a constriction point or a necking or bottle-neck area 310 along the spline shape. The constriction point 310, according to this embodiment, is configured to create an oscillatory pressure amplitude resulting from the reduced flow opening within the harvester pipe 330. While the constriction point 310, according to this embodiment, is positioned at a midpoint of the harvester pipe 330, it is not limited to this location, and may be positioned at a different location within the harvester pipe 330 to maximize the desired oscillatory pressure amplitude, as required. The constriction section 340 and point 310, according to this embodiment, are created in a spline shape such that two mirror-image spline shapes converge at a point to create the constriction point (or throat) 310, and diverge in a direction away from the constriction point 310 in a direction downstream to couple with an outlet section 354 at a first end, the outlet section 354 being coupled to the flow outlet 334 at an opposite second end, as shown in FIG. 9A. The outlet section 354, according to this embodiment, has an opening matching a widest section of the spline shape at the constriction section 340 and is configured to allow the fluid flow to exit the harvester pipe 330 through the flow outlet 334. The spline shape of the constriction section 340 as well as the outlet section 354 may be manufactured in a variety of ways, for example, using spline nozzle or constriction inserts 360, as shown in the embodiment of FIGS. 9A and 9G. These inserts 360 may be symmetrical with one another, or may be asymmetrical, and include the shape of the constriction section 340 and point 310, functioning like a mold, blocking fluid flow from areas where the inserts 360 are positioned.

The harvester pipe 330, according to this embodiment, as shown in FIGS. 9A-9C, also includes a piezoelectric actuator 20. The piezoelectric actuator 20 may include any form of piezoelectric actuator 20. In the embodiment shown in FIG. 9A-9C, the piezoelectric actuator 20, 220 is fixed within the harvester pipe 330 and includes a cantilever beam system 222 having a non-piezoelectric free end 224 extending from the inlet section 352 in the direction of fluid flow at least through the constriction section 340 and the constriction point 310. The piezoelectric actuator 20, 220, in this embodiment, is fixed in a particular position within the flow energy harvester 300 such that the fluid flow past the constriction point 340 from the inlet section 352 induces vibrations in the free end 224 sufficient to cause the direct piezoelectric effect in the piezoelectric actuator 20, 220 and to generate electrical power. The piezoelectric actuator 20 according to the embodiment shown in FIGS. 9A-9C may be a piezoelectric flextensional actuator 220 having a stack of at least two beams 226, at least one of which is a flextensional piezoelectric beam, integrated around a cantilever adaptor beam 227 which is coupled to the beam having a free end 224 that extends from the inlet section 352 in the direction of fluid flow. In an embodiment, the beam having a free end 224 that extends from the inlet section 352 is a non-piezoelectric metal beam. The piezoelectric flextensional actuator 220 may be made from any piezoelectric material suitable for a flextensional actuator 220. In one embodiment, the piezoelectric material of the flextensional actuator 200 is lead zirconate titanate (PZT).

The piezoelectric actuator 20, 220 according to the embodiment shown in FIGS. 9A-9C, may further include an electrical connection component 328 coupled to the stack of at least two beams 226, at least one of which is a flextensional piezoelectric beam, integrated around the cantilever adaptor beam 227 coupled to the beam having a free end 224 such that the electrical power generated by the vibrations in the beam at the free end 224 are transferred to the electrical connection component 328 which may then be connected to a battery, a supercapacitor, a power conditioning circuitry device such as a rectifier or a capacitance device, a DC to DC amplifier, etc., for storing the generated power. The electrical connection component 328 of the piezoelectric actuator 20, 220, according to this embodiment, may be accommodated within a flow diverter clamp 356, as shown in FIGS. 9A, 9D, and 9F, such that fluid flow is diverted around it. The flow diverter clamp 356, according to this embodiment, may be part of the flow diverter 350 and accommodated within the inlet section 352 and positioned along a centerline of the inlet section 352 spaced from the flow inlet 332 such that fluid entering the harvester pipe 330 is prevented from flowing through the flow diverter clamp 356 and is rerouted around the flow diverter clamp 356 in the inlet section 352. As shown in FIG. 9A, the flow diverter clamp 356 forces fluid flow to reroute around the non-exposed portions of the piezoelectric actuator 20, 220, including the electrical connection component 328.

According to an embodiment, for example, as shown in FIG. 9E, the harvester pipe 330 may have cut-outs or openings 228 defined in through an exterior of the harvester pipe 330 and coupled to a location where the electrical connection component 328 and diverter clamp 356 are positioned within the harvester pipe 330. The cut-outs or openings 228, according to this embodiment, allow for any wiring or electrical components necessary to connect with the electrical connection component 328 for energy transfer and storage to be run through the harvester pipe 330 in a location protected from fluid flow.

With continued reference to FIGS. 9A and 8E, the harvester pipe 330 may also include a fluid sealing mechanism 370 surrounding an inner diameter of the harvester pipe 330. The sealing mechanism 370, for example, may be an o-ring seal to prevent any fluid from leaking out of the harvester pipe 370 around the flow path created by the flow diverter 356. The harvester pipe 330 according to the embodiment shown in FIGS. 9A-9G is a planar pipe. However, in other embodiments, the harvester pipe 330 can include any shape, for example, the harvester pipe 330 may be a circular pipe.

Figure 10A:
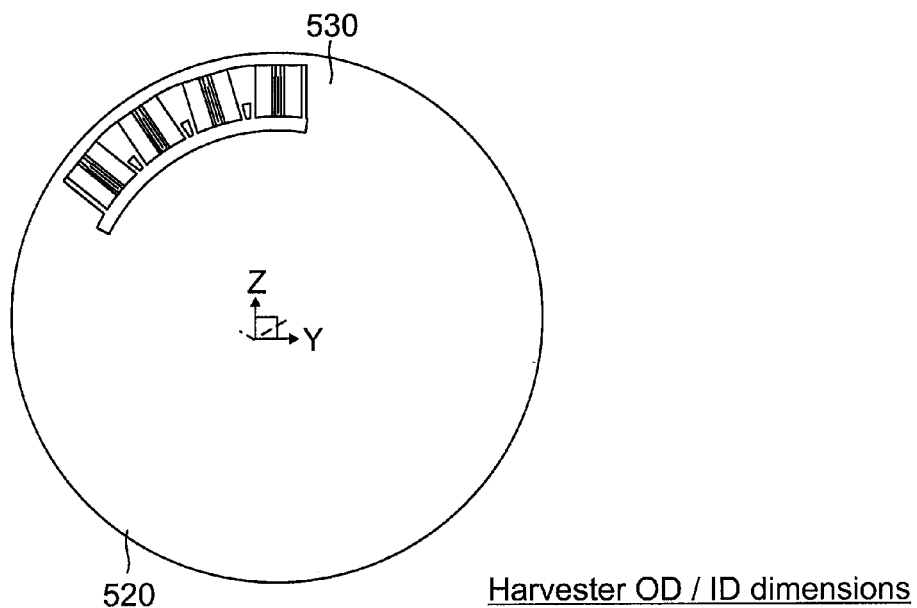
Figure 10B:
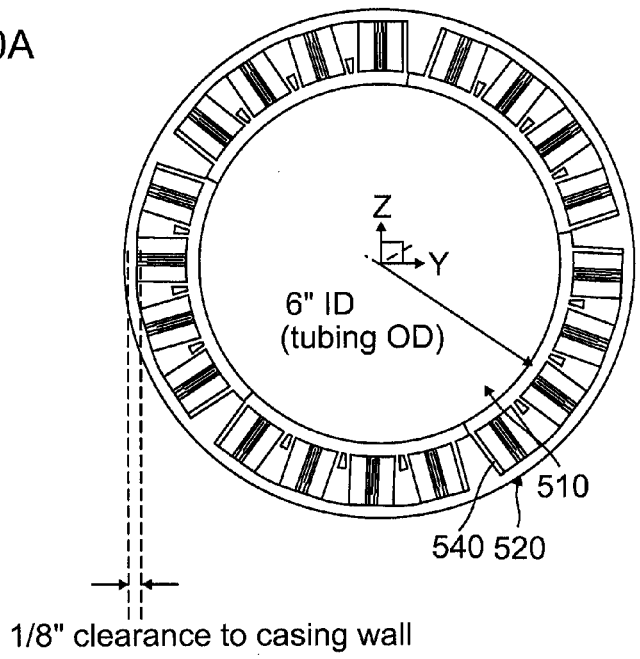
Figure 10C:
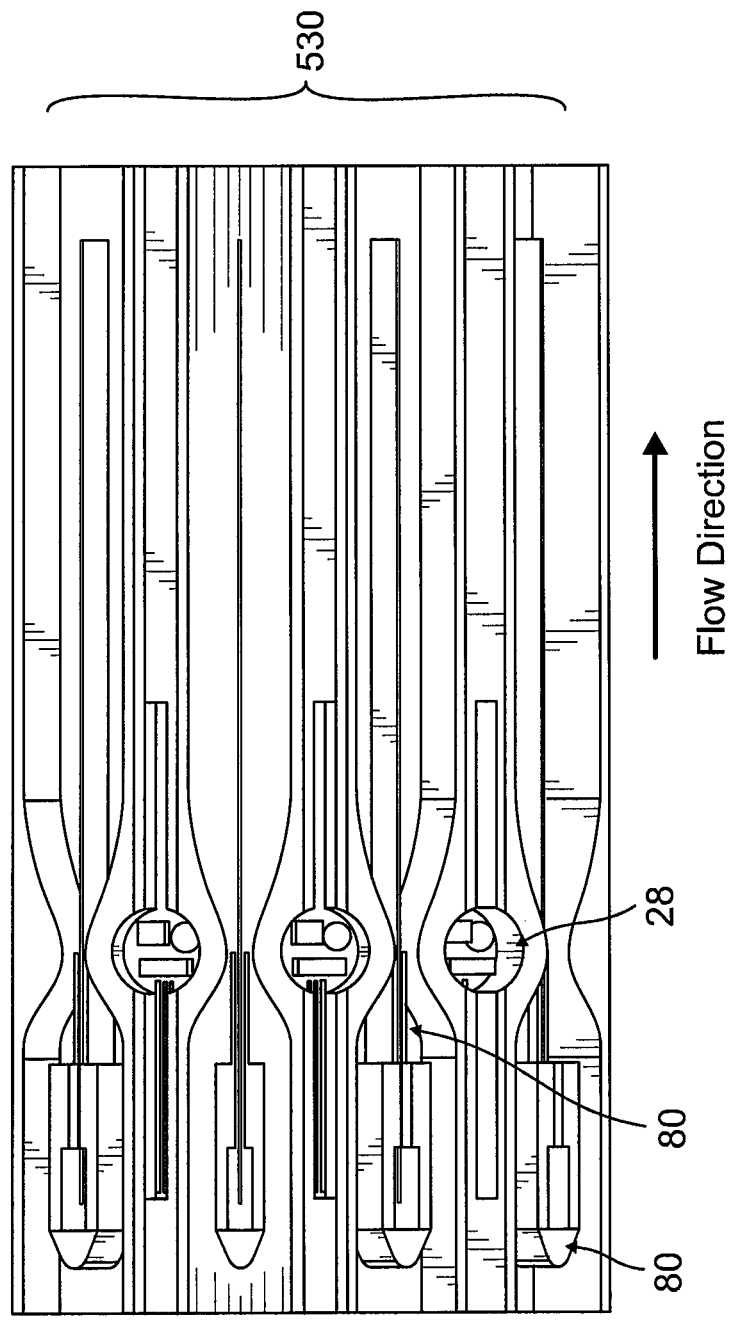
Figure 10H:
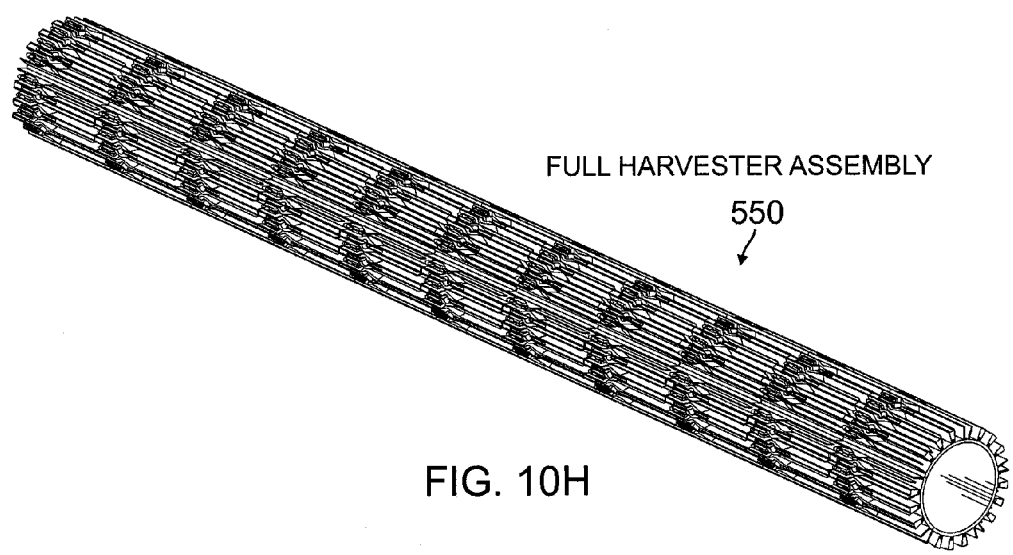

With reference to the embodiments shown in FIGS. 10A-10H and 10J, a flow energy harvesting system 500 including an array of flow energy harvesting devices 100 and configured to be integrated within an annular fluid flow path of a primary pipe 510 is shown. The flow energy harvesting system 500, according to this embodiment, may be positioned around a primary pipe, well, or tube 510 having an inner diameter and an outer diameter, and a casing or sleeve 520 positioned around the outer diameter or annulus of the primary pipe 510 and spaced from the primary pipe 510, as shown in FIGS. 10B, 10G, and 10H. The annular area between the primary pipe 510 and the casing or sleeve 520, according to these embodiments, may be subject to a fluid flow (for example, as discussed above regarding FIG. 2), and a plurality of flow energy harvesting devices 100 may positioned around the outer diameter of the primary pipe 510 between the casing 520 and the primary pipe 510, as shown in the embodiments in FIGS. 10B, 10H, and 10G, for example. As used herein, the term "plurality" means more than one. In an embodiment, for example as shown in FIG. 10B, the plurality of flow energy harvesting devices 100 may be spaced to have at least a 0.125 inch clearance from the casing 520.

In an embodiment, for example, as shown in FIG. 10B, the primary pipe 510 may have an outer diameter ranging from approximately 2.875 inches to approximately 9 inches, and the outer casing or sleeve 520 may have an inner diameter ranging from approximately 5.375 inches to approximately 9.5 inches. In an embodiment, the outer casing or sleeve 520 may have an inner diameter that is greater than 9.5 inches. In an embodiment, the outer diameter of the primary pipe 510 may be 6 inches, and the inner diameter of the outer casing or sleeve 520 may be 8.5 inches, such that with a 0.125 inch clearance from the casing 520, each flow energy harvesting device 100 is no greater than 2.375 inches in depth around the outer diameter of the primary pipe 510, in this embodiment.

With particular reference to the embodiments shown in FIGS. 10A, 10D-10F, and 10H, the plurality of flow energy harvesting devices 100 may consist of wedges 530 of flow energy harvesting devices 100, for example the flow energy harvesting devices 100, 200, 300 described above with reference to either of FIG. 8A or 9A. In an embodiment shown in FIG. 10A, for example, the flow energy harvesting devices 100 may be grouped in wedges 530, where each wedge 530 includes four flow energy harvesting devices 100, and each primary pipe 510 can accommodate a total of five wedges 530 around its outer diameter within the casing 520. Thus, the flow energy harvesting system 500 according to the embodiment shown in FIG. 10A, may include a total of 20 flow energy harvesting devices 100 around its perimeter in a single section 540. FIG. 10D depicts a schematic diagram of a single wedge unit or basic unit 530, including four flow energy harvesting devices 100, according to this embodiment. FIG. 10E depicts a schematic diagram of a single section 540, which includes a full set of five wedges or basic units 530 arranged annularly around the outer diameter of the primary pipe 510, each basic unit 530 including four flow energy harvesting devices 100, such that the section 540 includes 20 flow energy harvesting devices 100, according to the embodiment. FIG. 10F depicts a harvester assembly 550, which includes "N" number of sections 540 each having a full set of five wedges or basic units 530 arranged annularly around the outer diameter of the primary pipe 510, each section 530 including 20 flow energy harvesting devices 100, such that the N sections 540 includes 20*N flow energy harvesting devices 100, according to the embodiment.

The flow energy harvesting devices 100, according to these embodiments, and as shown in FIGS. 10C and 10G, may be connected to adjacent flow energy harvesting devices 100 either in parallel or in series such that a power output of the flow energy harvesting system 500 is derived from the plurality of flow energy harvesting devices 100. As shown in the embodiment in FIG. 10C, for example, the flow energy harvesting system 500 may further include erosion resistant inserts 80, for example, tungsten carbide, or any suitable erosion-resistant material, positioned around the piezoelectric actuators 20 within a fluid flow path. Each flow energy harvesting device 100 in the embodiment shown in FIG. 10C may further include a cut-out or opening 28 accessing the piezoelectric actuator 20 for an electrical connection to a power storage device, an electronic device, or to allow wires to be run through and routed against the annular pipe or tube 510, 520 for connecting adjacent flow energy harvesting devices 100 to each other in parallel or in series. With further reference to the embodiment shown in FIG. 10G, larger wires 90 connecting adjacent flow energy harvesting devices 100 may be run axially along a length of the exterior of the primary pipe 510 for series connection of adjacent flow energy harvesting devices 100. Each wedge 530 in a section 540, according to this embodiment, may include a pair of these axial cables 90. Within the inner diameter of the primary pipe 510, ribbon strips 95 may be positioned and tucked, according to the embodiment shown in FIG. 10G. In this embodiment, the ribbon strips 95 may be used to connect adjacent flow energy harvesting devices 100 in parallel to the axial cables 90 running axially along the length of the exterior of the primary pipe 510.

Figure 10J:
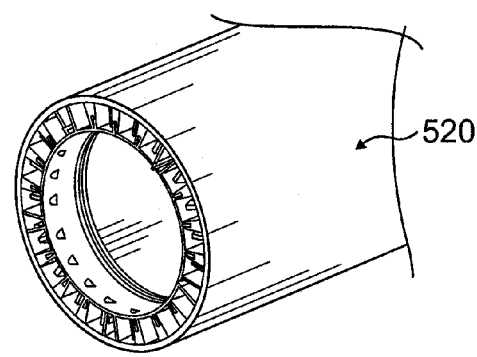

As shown in FIGS. 10H and 10J, the array of flow energy harvesting devices 100 of the flow energy harvesting system 500 may be positioned around the outer diameter of the primary pipe 510 between the casing 520 and the primary pipe 510 in wedges 530 and sections 540. The flow energy harvesting system 500 according to the embodiment shown in FIG. 10H may include ten sections 540 lined up along a length of the primary pipe 510 with the flow energy harvesting devices 100 each aligned and connected with the respective flow energy harvesting devices 100 in the adjacent section 540 such that a total of 200 flow energy harvesting devices 100 are positioned along the annulus of the primary pipe 510. The outer casing or sleeve 520, for example a 6 millimeter thick tube to protect the flow energy harvesting devices 100 may be placed around the flow energy harvesting system 500 and sealed against any pressure differentials, according to an embodiment.

According to an embodiment, each flow energy harvesting device 100 may be less than or equal to 4 inches in length, less than or equal to 1 inch in width, and less than or equal to 1 inch in thickness, and may produce at least 1 mW of power. The flow energy harvesting system 500, according to this embodiment and the embodiment shown in FIG. 10H, for example, having a total of 200 flow energy harvesting devices 100, may, thus, produce at least 200*1 mW or 200 mW of power. In another embodiment, each flow energy harvesting device 100 of the flow energy harvesting system 500 may produce up to 20 mW of power, such that the flow energy harvesting system 500 may, thus, produce at least 200*20 mW or 4 W of power.

Figure 11:
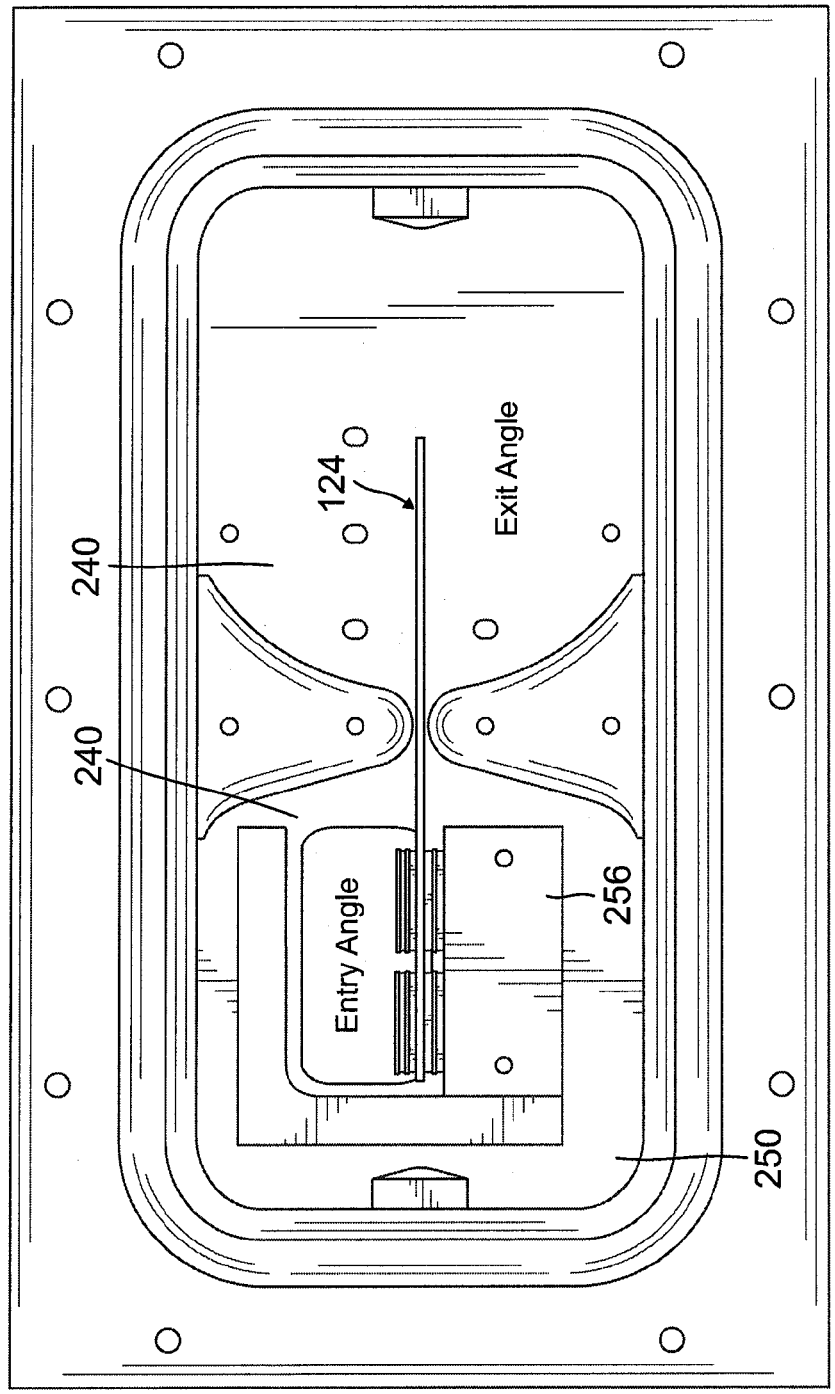
FIG. 11 is a schematic diagram illustrating a flow energy harvester having a spline flow constriction section and a piezoelectric bimorph actuator according to an embodiment including an Entry Angle and an Exit Angle for reference in conjunction with FIG. 12.

With reference to FIGS. 11 and 12, specific parameters and ranges of embodiments of the present invention that have been tested as well as other useful parameters and ranges according to other embodiments of the invention are provided in the schematic diagram shown in FIG. 11 illustrating the flow energy harvester having a spline flow constriction section and a piezoelectric bimorph actuator according including an Entry Angle and an Exit Angle for reference in conjunction with the tables in FIG. 12 including the dimensions, parameters, flow date, and ranges for a flow energy harvesting device according to embodiments of the present invention.

While this invention has been described in detail with particular references to embodiments, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims. Although relative terms such as "outer," "inner," "upper," "lower," "below," "above," "vertical," "horizontal," "top," "bottom," "middle," and similar have been used herein to describe a spatial relationship of one element to another, it should be understood that these terms are intended to encompass different orientations of the various elements and components of the invention in addition to the orientation depicted in the figures. Additionally, as used herein, the term "substantially," "about," "approximately," and similar are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Instead, for each embodiment, one or more of the tasks described above may be absent and/or additional tasks may be performed. Furthermore, as used herein, when a component is referred to as being "on" another component, it can be directly or indirectly on the other component, meaning, for example, intervening layers, regions, or components may also be present. Moreover, when a component is referred to as being "coupled" to another component, it can be directly attached or connected to the other component, or other intervening components may also be present therebetween.

While the invention has been described in connection with certain embodiments, it is to be understood by those skilled in the art that the invention is not limited to the disclosed embodiments, but, on the contrary, is intended to cover various modifications included within the spirit and scope of the appended claims and equivalents thereof

What is claimed is:

1. A flow energy harvesting device configured to be integrated with a fluid flow path of a primary pipe, the flow energy harvesting device comprising a harvester pipe comprising:

a flow inlet that receives flow from the primary pipe at one end and a flow outlet at a different part of the harvester pipe that returns the flow into the primary pipe;

a flow diverter fitted within the harvester pipe and coupled to the flow inlet and the flow outlet, the flow diverter being configured to redirect the fluid flow from the main pipe through the harvester pipe and comprising an inlet section coupled to the flow inlet at a first end, a flow constriction section coupled to the inlet section and positioned at a midpoint of the harvester pipe, the flow constriction section having a spline shape with a substantially reduced flow opening size at a constriction point along the spline shape and configured to create oscillatory pressure amplitude resulting from the reduced flow opening within the harvester pipe, and an outlet section coupled to the constriction section at a first end and coupled to the flow outlet at an opposite second end, the outlet section having an opening matching a widest section of the spline shape at the constriction section and configured to allow the fluid flow to exit the harvester pipe through the flow outlet; and a piezoelectric actuator comprising a cantilever beam having a free end, wherein the free end extends from the inlet section in the direction of fluid flow at least through the constriction section and the constriction point such that the fluid flow past the constriction point from the inlet section induces vibrations in the free end sufficient to cause a direct piezoelectric effect in the piezoelectric actuator and to generate electrical power.

2. The flow energy harvesting device of claim 1, wherein the piezoelectric actuator comprises a bimorph.

3. The flow energy harvesting device of claim 2, wherein the piezoelectric material of the bimorph comprises lead zirconate titanate (PZT).

4. The flow energy harvesting device of claim 2, wherein
the flow diverter further comprises a flow diverter clamp accommodated within the inlet section and positioned along a centerline of the inlet section spaced from the flow inlet such that fluid entering the harvester pipe is prevented from flowing through the flow diverter clamp and is rerouted around the flow diverter clamp in the inlet section; and
the piezoelectric actuator further comprises an electrical connection component accommodated within the flow diverter clamp such that fluid flow is diverted around it, the electrical connection component being coupled to the cantilever beam at an end opposite to the free end such that the electrical power generated by the vibrations in the beam at the free end are transferred to and stored on an external power storage device through the electrical connection component.

5. The flow energy harvesting device of claim 1, wherein the piezoelectric actuator comprises a piezoelectric flextensional actuator comprising a stack of at least two beams, at least one of which is a flextensional piezoelectric beam, integrated around a cantilever adaptor beam, the cantilever adaptor beam being coupled to the beam having a free end that extends from the inlet section in the direction of fluid flow at least through the constriction section and the constriction point and being configured to undergo and transmit oscillatory vibrations to the piezoelectric flextensional actuator via the cantilever adaptor beam.

6. The flow energy harvesting device of claim 5, wherein the piezoelectric flextensional actuator comprises lead zirconate titanate (PZT).

7. The flow energy harvesting device of claim 6, wherein the electrical power generated by the vibrations transferred via the cantilever adaptor beam are further transferred to and stored on an external power storage device electrically connected to the piezoelectric flextensional actuator.

8. The flow energy harvesting device of claim 1, wherein the spline shape of the flow constriction section comprises a spline having a converging opening size which narrows to a minimum in cross-sectional flow area at the constriction point and then diverges to a maximum cross-sectional flow area of the flow constriction section where it is coupled to the outlet section, creating a flow area through the constriction point designed to have flow velocity greater than 5 meters per second (m/s).

9. The flow energy harvesting device of claim 8, wherein the flow area through the constriction point is designed to have flow velocity greater than 20 meters per second (m/s).

10. The flow energy harvesting device of claim 1, wherein the piezoelectric actuator is a piezoelectric unimorph actuator.

11. The flow energy harvesting device of claim 1, wherein the harvester pipe is a planar pipe.

12. The flow energy harvesting device of claim 1, wherein the harvester pipe is a circular pipe.

13. The flow energy harvesting device of claim 1, wherein the flow energy harvesting device is configured to be integrated with the fluid flow path in an oil well production casing within a circumferential region surrounding an outer diameter of an inner pipe.

14. The flow energy harvesting device of claim 1, wherein the flow constriction section comprises a pair of flow constrictor inserts positioned closer to the end of the harvester pipe at the outlet section, each flow constrictor insert having a cubic or higher order spline shape that is a mirror image of the other such that the pair of flow constrictors creates the flow constriction point at the midpoint of the harvester pipe having the substantially reduced opening size.

15. A flow energy harvesting system configured to be integrated with a fluid flow path of a primary pipe, the flow energy harvesting system comprising:
a primary pipe having an inner diameter and an outer diameter;
a casing positioned around the outer diameter of the primary pipe and annularly spaced from the primary pipe, the annular area between the primary pipe and the casing being subject to a fluid flow; and
a plurality of flow energy harvesting devices positioned around the outer diameter of the primary pipe between the casing and the primary pipe, the plurality of flow energy harvesting devices having a clearance from the casing,
wherein each flow energy harvesting device of the plurality of flow energy harvesting devices is connected in series and/or in parallel to adjacent flow energy harvesting devices of the plurality of flow energy harvesting devices such that a power output of the flow energy harvesting system is derived from the plurality of flow energy harvesting devices.

16. The flow energy harvesting system of claim 15, wherein each flow energy harvesting device of the plurality of flow energy harvesting devices comprises a harvester pipe comprising:
a flow inlet that receives flow from the annular area around the primary pipe at one end and a flow outlet at a different part of the harvester pipe that returns the flow into the annular area;
a flow diverter fitted within the harvester pipe and coupled to the flow inlet and the flow outlet, the flow diverter being configured to redirect the fluid flow from the main pipe through the harvester pipe and comprising
an inlet section coupled to the flow inlet at a first end,
a flow constriction section coupled to a second end of the inlet section and positioned at a midpoint of the harvester pipe, the flow constriction section having a spline shape with a substantially reduced flow opening size at a constriction point along the spline shape and configured to create oscillatory pressure amplitude resulting from the reduced flow opening within the harvester pipe, and
an outlet section coupled to the constriction section at a first end and coupled to the flow outlet at an opposite second end, the outlet section having an opening matching a widest section of the spline shape at the constriction section and configured to allow the fluid flow to exit the harvester pipe through the flow outlet; and
a piezoelectric element comprising a cantilever beam having a free end, wherein the free end extends from the inlet section in the direction of fluid flow at least through the constriction section and the constriction point such that the fluid flow past the constriction point from the inlet section induces vibrations in the free end sufficient to cause a direct piezoelectric effect in the piezoelectric element and to generate electrical power.

17. The flow energy harvesting system of claim 16, wherein the piezoelectric element comprises a lead zirconate titanate (PZT) bimorph.

18. The flow energy harvesting system of claim 15, wherein the plurality of flow energy harvesting devices are positioned around the outer diameter of the primary pipe between the casing and the primary pipe in wedges and sections, wherein
- each wedge comprises a plurality of flow energy harvesting devices positioned side by side around the outer diameter of the primary pipe and connected in series or in parallel to each adjacent flow energy harvesting device,
- each section comprises at least two wedges, each wedge comprising a plurality of flow energy harvesting devices positioned side by side around the outer perimeter of the primary pipe, and
- the flow energy harvesting system comprises at least one section, each section being lined up along a length of the primary pipe with the flow energy harvesting devices each aligned and connected with the respective flow energy harvesting device in the adjacent section.

19. The flow energy harvesting system of claim 18, wherein the primary pipe has an outer diameter ranging from approximately 2.875 inches to approximately 9 inches and the casing has an inner diameter ranging from approximately 5.375 inches to approximately 9.5 inches.

20. The flow energy harvesting system of claim 18, wherein each flow energy harvesting device is less than or equal to 4 inches in length, less than or equal to 1 inch in width, and less than or equal to 1 inch in thickness, and produces at least 1 milliwatt (mW) of power.

* * * * *